(12) United States Patent
Matsuyama et al.

(10) Patent No.: US 7,813,397 B2
(45) Date of Patent: Oct. 12, 2010

(54) NITRIDE SEMICONDUCTOR LASER DEVICE

(75) Inventors: Yuji Matsuyama, Tokushima (JP); Shinji Suzuki, Naka-gun (JP); Kousuke Ise, Naka-gun (JP); Atsuo Michiue, Anan (JP); Akinori Yoneda, Anan (JP)

(73) Assignee: Nichia Corporation, Anan-shi (JP)

( * ) Notice: Subject to any disclaimer, the term of this patent is extended or adjusted under 35 U.S.C. 154(b) by 30 days.

(21) Appl. No.: 12/100,247

(22) Filed: Apr. 9, 2008

(65) Prior Publication Data

US 2008/0192788 A1    Aug. 14, 2008

Related U.S. Application Data

(63) Continuation of application No. 10/907,398, filed on Mar. 31, 2005, now Pat. No. 7,408,199.

(30) Foreign Application Priority Data

Apr. 2, 2004  (JP)  .............................. 2004-110019
Jul. 30, 2004  (JP)  .............................. 2004-223755

(51) Int. Cl.
*H01S 5/00* (2006.01)
*H01L 27/15* (2006.01)

(52) U.S. Cl. .............................. 372/44.011; 372/43.01; 372/45.011; 257/79

(58) Field of Classification Search ... 372/43.01–46.01; 257/79, 103
See application file for complete search history.

(56) References Cited

U.S. PATENT DOCUMENTS

| 2001/0030329 | A1 | 10/2001 | Ueta et al. | |
|---|---|---|---|---|
| 2002/0027933 | A1 | 3/2002 | Tanabe et al. | |
| 2002/0054617 | A1 | 5/2002 | Tsuda et al. | |
| 2003/0001238 | A1* | 1/2003 | Ban | 257/627 |
| 2003/0037722 | A1* | 2/2003 | Kiyoku et al. | 117/84 |
| 2003/0205717 | A1 | 11/2003 | Khare et al. | |
| 2004/0206299 | A1 | 10/2004 | Tadamoto et al. | |
| 2004/0238810 | A1 | 12/2004 | Dwilinski et al. | |
| 2005/0026398 | A1 | 2/2005 | Nakamura | |
| 2005/0030994 | A1* | 2/2005 | Kozaki et al. | 372/43 |
| 2005/0042787 | A1 | 2/2005 | Ito et al. | |
| 2006/0078024 | A1* | 4/2006 | Matsumura et al. | 372/46.01 |
| 2006/0213429 | A1 | 9/2006 | Motoki et al. | |
| 2008/0080578 | A1* | 4/2008 | Kamikawa et al. | 372/44.011 |

FOREIGN PATENT DOCUMENTS

| JP | 2000-156348 A | 6/2000 |
|---|---|---|
| JP | 2000-223743 A | 8/2000 |

(Continued)

*Primary Examiner*—Minsun Harvey
*Assistant Examiner*—Phillip Nguyen
(74) *Attorney, Agent, or Firm*—Global IP Counselors, LLP

(57) ABSTRACT

A nitride semiconductor laser device includes, on a first principle face of the (0001) of a nitride semiconductor substrate, a nitride semiconductor layer having a first conductivity type, an active layer, and a nitride semiconductor layer having a second conductivity type that is different from the first conductivity type, and being formed a stripe ridge on the surface thereof. The (000-1) face and an inclined face other than the (000-1) face are exposed on a second principal face of the nitride semiconductor substrate. The inclined face other than the (000-1) face represents no less than 0.5% over the surface area of the second principal face.

8 Claims, 13 Drawing Sheets

FOREIGN PATENT DOCUMENTS

| | | |
|---|---|---|
| JP | 2000-331937 A | 11/2000 |
| JP | 2001-057463 A | 2/2001 |
| JP | 2002-016000 A | 1/2002 |
| JP | 2002-094189 A | 3/2002 |
| JP | 2003-115641 A | 4/2003 |
| JP | 2003-133587 A | 5/2003 |
| JP | 2003-133650 A | 5/2003 |
| JP | 2003-183100 A | 7/2003 |
| JP | 2004-071657 A | 3/2004 |
| JP | 2005-056979 A | 3/2005 |
| WO | WO-03/036771 A1 | 5/2003 |

\* cited by examiner

US 7,813,397 B2

NITRIDE SEMICONDUCTOR LASER DEVICE

CROSS-REFERENCE TO RELATED APPLICATIONS

This application is a continuation application of U.S. patent application Ser. No. 10/907,398 filed on Mar. 31, 2005. This application claims priority to Japanese Patent Application No. 2004-110019 filed on Apr. 2, 2004 and Japanese Patent Application No. 2004-223755 filed on Jul. 30, 2004. The entire disclosures of U.S. patent application Ser. No. 10/907,398, Japanese Patent Application Nos. 2004-110019 and 2004-223755 are hereby incorporated herein by reference.

BACKGROUND OF THE INVENTION

1. Field of the Invention

The present invention relates to nitride semiconductor devices comprising an active layer containing indium such as nitride semiconductor laser devices and laser diodes, light emitting diodes (LEDs), photodetectors, high-frequency transistors, and high-voltage transistors. More specifically, it relates to nitride semiconductor lasers and nitride semiconductor devices having improved device characteristics as the result of using a nitride semiconductor substrate having a specific off angle.

2. Background Information

Laser devices comprising nitride semiconductors such as GaN semiconductors can be used at emission wavelengths ranging from the ultraviolet region of 370 nm or less to wavelengths in the region of 500 nm or more. Substrates on which such laser devices are formed are grown using a lateral growth technique known as Epitaxial Lateral Overgrowth (ELO).

This is a technique wherein GaN is grown laterally to form a GaN layer on an underlying substrate on which a $SiO_2$ mask pattern having periodic stripe openings is formed. Next, the underlying substrate is removed to produce a substrate comprising only the GaN layer. The GaN in the laterally grown region constitutes a low-dislocation (or defect) region. As the resulting low-dislocation GaN has good crystalline characteristics, the life of nitride semiconductor laser devices using this GaN as a substrate can be increased.

Furthermore, there is a demand for improved device characteristics in nitride semiconductor laser devices. Consequently, a substrate is required wherein not only is the dislocation density of the substrate itself reduced, but on which it is possible to grow a nitride semiconductor layer having good crystalline characteristics. Moreover, in order to make practical use of the nitride semiconductor device, it is necessary that the diameter of the substrate itself be increased.

Consequently, a substrate has been proposed that comprises a hexagonal system nitride semiconductor and forms an off angle, in a predetermined direction, of no less than 1° and no greater than 20° from the (0001) plane (see, for example, Japanese Unexamined Patent Application JP-2002-016000-A).

However, the broad ranges proposed for the size and direction of this off angle for the nitride semiconductor substrate resulted in an uneven composition in indium, aluminum and the like, and an uneven distribution of impurities and the like within the laser device. In particular, in the case of laser devices comprising an active layer containing indium, depending on the emission wavelength, this may lead to increases in the threshold current. Nitride semiconductor laser devices are theoretically capable of laser emission over a broad range of wavelengths; in practice however, if compositional distribution, such as the distribution of indium in the active layer, is not uniform, problems arise such as the inability to achieve this broad emission range.

Furthermore, when preparing substrates having large diameters of greater than one inch, as pits and grooves remain on the principal face of the substrate, there are problems in that it is necessary to flatten the surface produced by forming the nitride semiconductor layer on the substrate.

SUMMARY OF THE INVENTION

The present invention addresses the issues described above, and therefore an object of the present invention is to provide a device wherein the nitride semiconductor layer has uniform compositional distribution; for example, having uniform crystalline characteristics and indium content in the active layer, and thus having improved working life and device characteristics over a broad range of wavelengths.

Accordingly, a nitride semiconductor laser device of a first aspect of the present invention includes, on a first principle face of the (0001) of a nitride semiconductor substrate, a nitride semiconductor layer having a first conductivity type, an active layer, and a nitride semiconductor layer having a second conductivity type that is different from the first conductivity type, and being formed a stripe ridge on the surface thereof. The (000-1) face and an inclined face other than the (000-1) face are exposed on a second principal face of the nitride semiconductor substrate. The inclined face other than the (000-1) face represents no less than 0.5% over the surface area of the second principal face.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

The nitride semiconductor laser device and the nitride semiconductor device of the present invention (hereinafter both may be referred to simply as "devices") comprise a nitride semiconductor substrate (hereinafter also referred to simply as a "substrate"), and on a first principle face thereof are provided a nitride semiconductor layer of a first conductivity type (hereinafter also referred to simply as a "semiconductor layer"), an active layer, and a nitride semiconductor layer of a second conductivity type (different from the first conductivity type), in that order. Note that the nitride semiconductor device may be a laser device and may be an LED. Specifically, if this is a laser device, it is preferable that the nitride semiconductor layer of the second conductivity type comprise a stripe ridge.

This device may comprise a second electrode disposed on the nitride semiconductor layer of the second conductivity type, so as to produce a paired electrode structure wherein a first electrode is provided on a second principal face of the substrate (the principal face opposite the first principal face). By virtue of this structure, the fabrication process can be made more stable, allowing high-quality devices into which large currents can be injected and capable of producing high output oscillation, to be produced at good production yields. However, both the first and the second electrode may be disposed on the side of the first principal face.

Hereinafter, the nitride semiconductor laser device of the present invention and a method for fabricating the same are described.

Figure 1A:
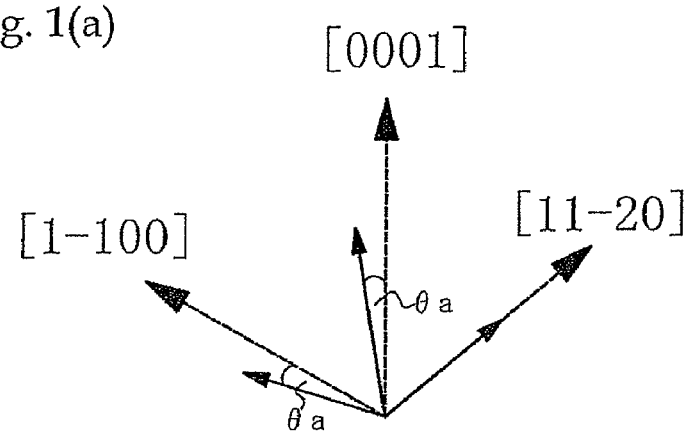
FIG. 1(a) is a schematic perspective view of a nitride semiconductor laser device according to the present invention (b) and a diagram serving to describe the off angle thereof (a)
Figure 1B:
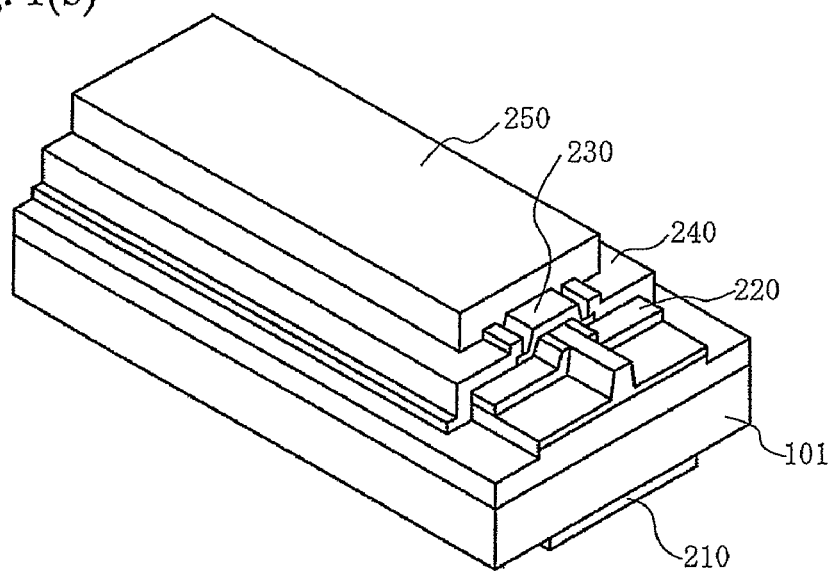
Figure 2A:
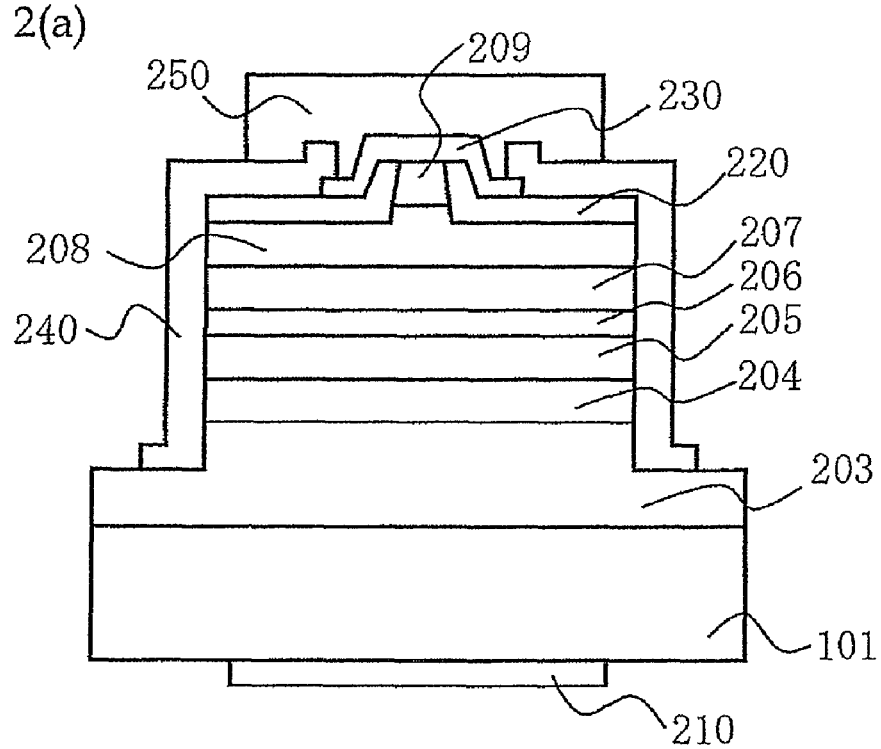
FIGS. 2 (a) and (b) are schematic sectional views of nitride semiconductor laser devices according to the present invention.

As shown in FIG. 1(b) and FIG. 2(a), the device is such that a nitride semiconductor layer having a first conductivity type, an active layer and a nitride semiconductor having a second conductivity type are formed, in this order, on a nitride semiconductor substrate 101, and a stripe ridge is formed on the nitride semiconductor layer having the second conductivity type.

Figure 3A:
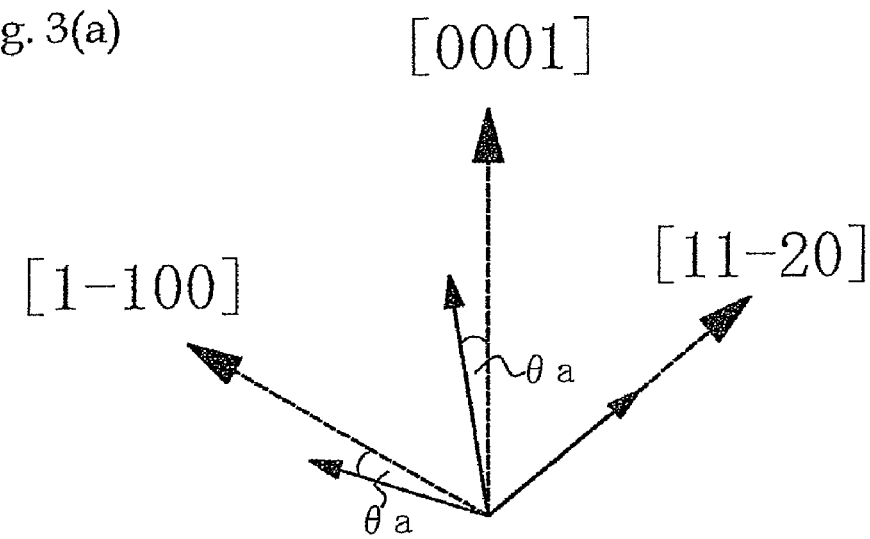
FIGS. 3 (a) and (b) are diagrams serving to describe the off angle of a nitride semiconductor substrate according to the present invention.
Figure 3B:
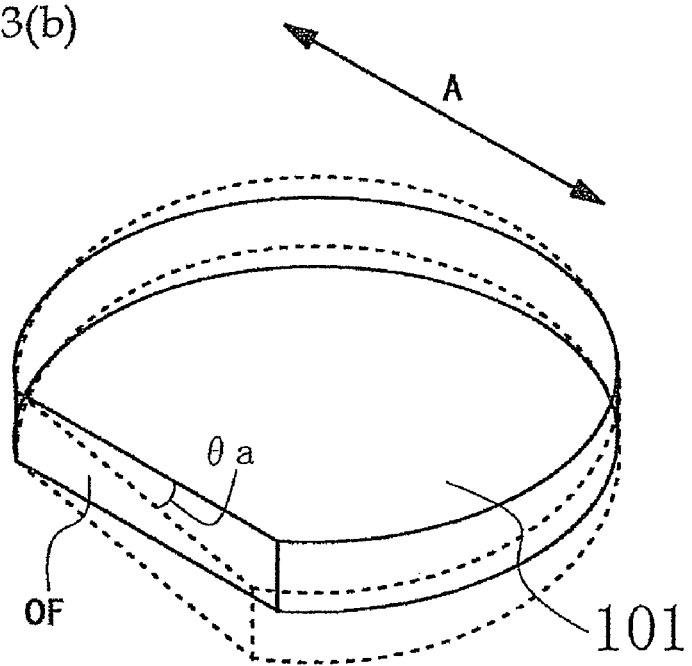

As shown in FIG. 1(a) and FIGS. 3(a) and (b), the principal face of the substrate 101 is inclined in a direction A that is substantially parallel to the ridge, at an off angle a ($\theta_a°$) from, for example, the direction [0001] and the direction [1-100]. In other words, the expression "principal face of the substrate" refers to a face having an off angle a with respect to a predetermined reference crystal plane (a plane not inclined at the off angle, such as the C plane) of the substrate.

Figure 4:
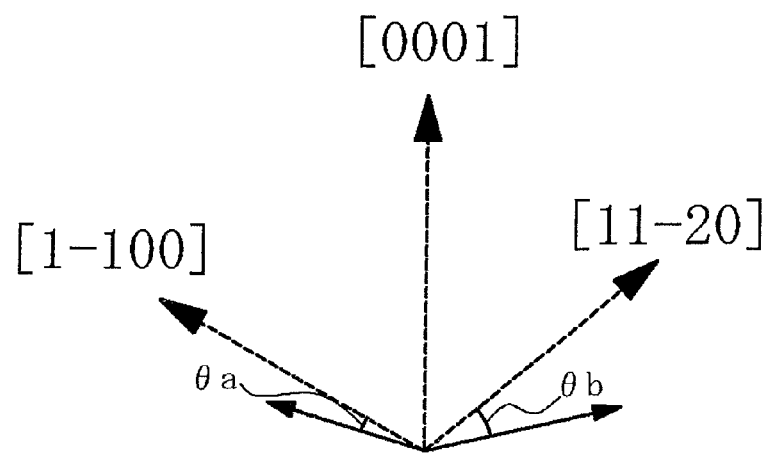
FIGS. 4 (a) and (b) are diagrams serving to describe another off angle of a nitride semiconductor substrate according to the present invention.
Figure 4B:
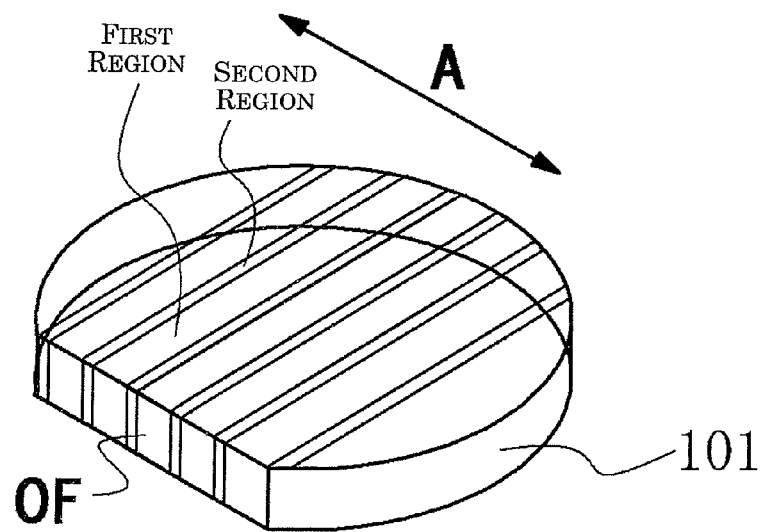

Furthermore, as shown in FIGS. 4(a) and (b), in addition to the principal face of the substrate being inclined in the direction A, which is substantially parallel to the ridge, at the off angle a with respect to the predetermined reference crystal plane, the principal face of the substrate may be inclined in a direction substantially perpendicular to the orientation flat (OF) plane, for example the direction [11-20] at an off angle b ($\theta_b°$).

Herein, the term "reference crystal plane" refers to a crystal plane such as the C plane, M plane, A plane, or R plane. From among these, the C plane (0001), the M plane (1-100) the A plane (11-20) and the like are preferred. The term "off angle" refers to an angle of inclination formed by the surface of the substrate with respect to a predetermined reference crystal plane. It is preferable that an off angle be formed in at least a direction that is substantially parallel to the stripe ridge (off angle a); it is further preferable that an off angle be formed in a direction orthogonal to the direction in which the off angle a is formed (off angle b). The expression "formed in a direction substantially parallel to" encompasses formation descending in the direction of the output-face cavity end, formation descending in the direction of the reflecting-face cavity end, or formation in a direction substantially perpendicular to the M plane (1-100). As a result, the morphology and composition (for example, the ratio of indium in the mixed crystal) of the surface of the active layer located directly below the ridge can be made uniform.

Preferable absolute values $|\theta_a|$ for the off angle a are approximately 0.02° to 5°, approximately 0.1° to 0.7°, and more preferably approximately 0.15° to 0.6°, approximately 0.1° to 0.5°, approximately 0.15° to 0.4°, and approximately 0.2° to 0.3°. Preferable absolute values $|\theta_b|$ for the off angle b are greater than 0°, approximately 0° to 0.7°, approximately 0° to 0.5°, 0° to less than 0.5°, and approximately 0° to 0.3°. If the substrate has an off angle a and an off angle b, it is preferable that $|\theta_a|>|\theta_b|$. As a result, the surface morphology of the semiconductor layer grown on the principal plane of the substrate is flattened in plane. Furthermore, the compositional distribution of aluminum, indium and the like within the semiconductor layer can be made more uniform. Specifically, it is possible to homogenize compositional distribution even in semiconductor layers wherein the indium component in the active layer exceeds 5%, which was difficult with conventional substrates.

Figure 5:
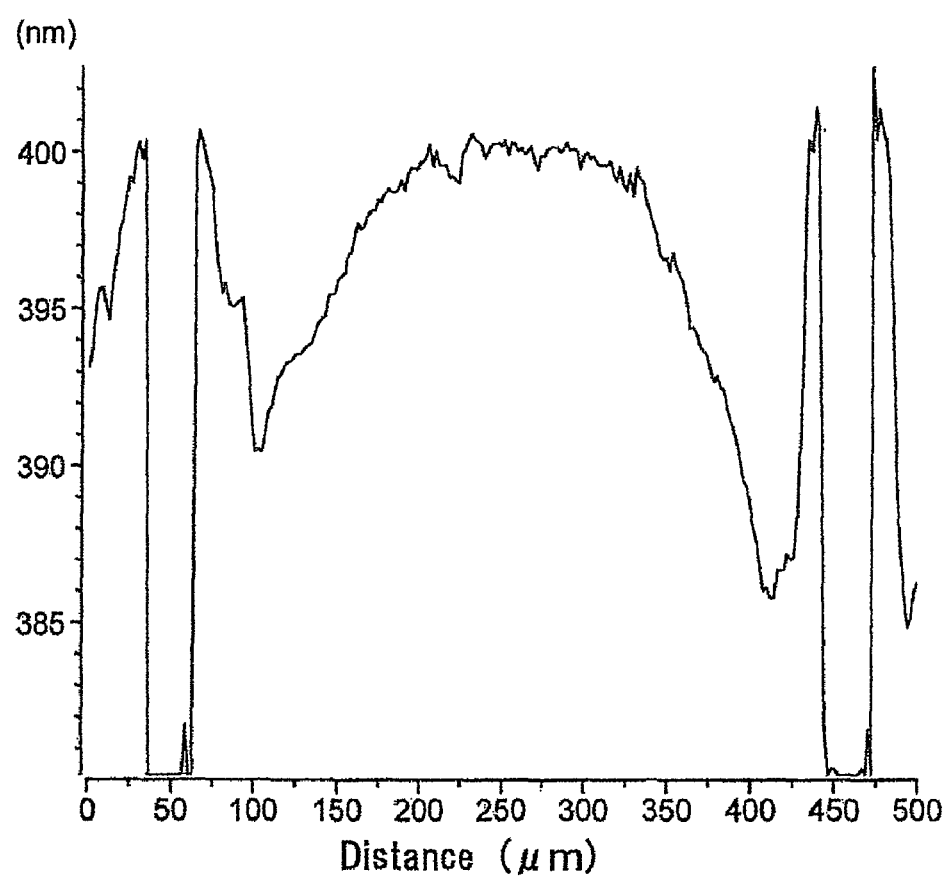
FIG. 5 is micro-PL measurement data for a conventional nitride semiconductor laser device.

In other words, if an off angle such as that described above is formed, the device characteristics can be improved in the range extending from the ultraviolet region of 365 nm or less to the long wavelength region of 500 nm or more. When the interior of the ridge or the chip is observed by micro-PL, as compared to the variation in the indium component in the active layer of a semiconductor grown on a substrate that does not have an off angle, which is large (FIG. 5), when a substrate having an off angle, such as that described above, is used, it is possible to limit the variation in the indium component of the active layer.

The semiconductor layers constitute a separate confinement heterostructure wherein the active layer is interposed between a semiconductor having a first conductivity type (for example, n-type) and a semiconductor layer having a second conductivity type (for example, p-type).

It is preferable that the active layer contain indium. By these means, a device having a broad wavelength range can be realized. Furthermore, this may have a multiple quantum well or a single quantum well structure. The use of a quantum well structure allows for increases in emission efficiency. An optical waveguide can be constituted by providing semiconductor layers having bandgaps greater than the active layer above and below the active layer. Moreover, by forming a cladding layer (a layer having a low refractive index) on either side of the active layer, it is possible to confine both light and carriers.

Step I

A nitride semiconductor substrate having an off angle can be formed in the following manner.

Figure 7:
FIG. 7 (a) to (d) are sectional views showing a fabrication process for the nitride semiconductor substrate according to the present invention.
Figure 7:
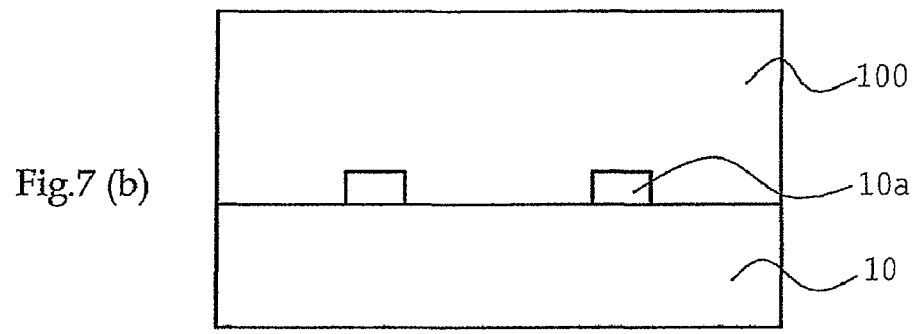
Figure 7:
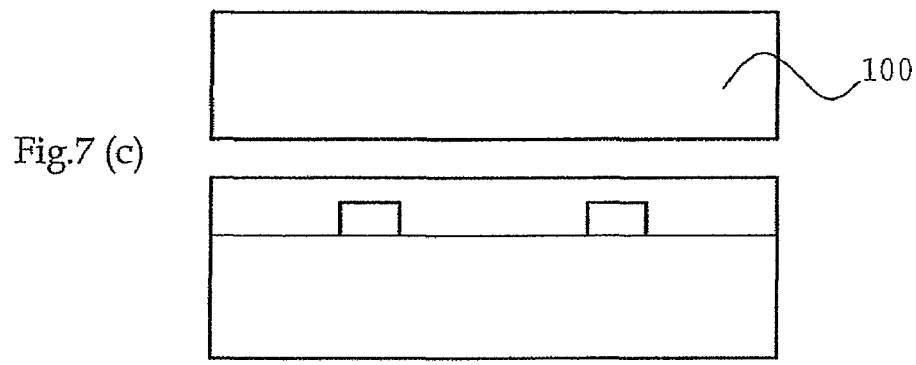
Figure 7:
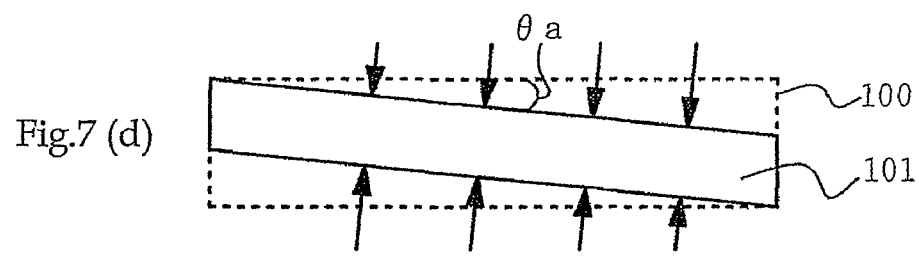

First, as shown in FIG. 7(a), a heterosubstrate 10, comprising a material other than a nitride semiconductor, is provided. Examples of the heterosubstrate include sapphire, GaAs, SiC, Si, spinel, $SiO_2$, SiN, ZnO and the like. It is preferable that the surface of the heterosubstrate 10 on which the nitride semiconductor is subsequently grown be such that the growing face is the (0001) face, the (11-20) face or the (1-100) face.

A buffer layer (not shown in the drawing) comprising $Al_xGa_{1-x}N$ ($0 \leq x \leq 1$) is grown on the surface of the heterosubstrate 10. The buffer layer is grown at a temperature of no greater than 900° C. at reduced or normal pressure by, for example, metalorganic chemical vapor deposition (MOCVD). In the present invention, the semiconductor layers can be grown using any known method for growing nitride semiconductors, including vapor phase growth methods such as an MOCVD, halide vapor phase epitaxy (HVPE) and molecular beam epitaxy (MBE).

Thereafter, as shown in FIG. 7(b), protrusions 10a are formed on the surface of the heterosubstrate 10, for example, with a buffer layer therebetween.

Next, a nitride semiconductor layer is grown to obtain a nitride semiconductor layer 100 having reduced dislocation density. The thickness of this semiconductor layer 100 is approximately 50 µm to 10 mm, and preferably approximately 100 µm to 1000 µm. A thickness within this range facilitates formation of the off angle and handling in the subsequent steps.

Next, as shown in FIG. 7(c), the heterosubstrate is removed by abrasion, grinding, electromagnetic radiation (e.g., excimer laser bombardment), CMP or the like, then isolating the nitride semiconductor layer 100 as a single body, to produce a nitride semiconductor substrate. The growing face of the semiconductor layer 100 is the first principal face of this substrate, and the face exposed by removing the heterosubstrate 10 is the second principal face.

Note that it is not absolutely necessary to remove the heterosubstrate at this point. The heterosubstrate may be left until the n-electrode is formed as described below, or it may be left permanently.

It is preferable that the first surface of the nitride semiconductor substrate produced include a (0001) face, a (11-20) face, a (1-100) face (M plane) or the like. As a result it is possible to reduce the density of dislocations formed by the interface between the substrate and the nitride semiconductor layer. Furthermore, it allows for better reproducibility in the step of separation from the wafer by cleavage or the like.

Dislocations may be periodically distributed in plane in the first surface of the substrate. Examples include alternating stripes of low dislocation density regions (for example, the first region) and high dislocation density regions (for example, a second region) using ELO. By these means, it is possible to relieve stress within the substrate, and the nitride semiconductor layer can be grown thereupon, without forming a stress relaxation layer on the substrate.

Furthermore, it is preferable that the polarities of the first region and the second region be separated as stripes. This is so as to limit stress and strain generated in the substrate. Furthermore, it allows for better reproducibility in the step of separation from the wafer by cleavage or the like.

Herein, the expression "low dislocation density region" refers to a region where the number of dislocations per unit of surface area is no greater than $1 \times 10^7/cm^2$, preferably no greater than $1 \times 10^6/cm^2$, and more preferably no greater than $5 \times 10^5/cm^2$. The expression "high dislocation density region" refers to a region having a higher dislocation density than that of the low dislocation density region.

If the first region and the second region are formed as alternating stripes, it is preferable that the width of the first region be 10 µm to 500 µm, and more preferably 100 µm to 500 µm. The width of the second region is 2 µm to 100 µm and preferably 10 µm to 50 µm.

Dislocations can be measured by CL microscopy, TEM microscopy, or the like.

For example, if the (0001) plane is used for the low dislocation density region formed on the first surface, the crystal growth face for the high dislocation density region is a plane other than the (0001) plane, such as the (000-1) plane, the (11-20) plane, the (10-14) plane, the (10-15) plane, the (11-24) plane or the like. The (000-1) face is particularly preferred. By using a substrate wherein partial crystal growth faces have differing planes, it is possible to relax stress and strain that arises within the substrate, and it is possible to deposit a semiconductor layer having a thickness of 5 µm or more without forming a stress relaxation layer on the substrate. That is to say, it is possible to reduce warping and cracking of the wafer. The stripes described above encompass those formed as dotted lines.

Note that it is preferable that the second surface of the nitride semiconductor have no less than two different crystal growth faces; specific examples thereof include the (000-1) plane, the (0001) plane, the (11-20) plane, the (10-15) plane, the (10-14) plane, the (11-24) plane and the like. In the present specification, in the Miller indices given within parentheses, the bar (-) indicates an overbar above the following numeral.

Furthermore, there are no particular restrictions on the peripheral shape of the substrate, and this may be in the form of a wafer, a rectangle or the like. If this is a wafer, it is preferable that this be no less than 1 inch in size and more preferable that this be no less than 2 inches in size.

It is preferable that the half value width (full width at half maximum) of the (0002) x-ray diffraction locking curve, according to the biaxial crystal method, be no greater than two minutes, and no greater than one minute is preferred.

Note that examples of nitride semiconductor substrates include compounds of group III elements (B, Ga, Al, In, etc.) and nitrogen compounds or mixed crystals (GaN, AlN, AlGaN, InAlGaN, etc.). Furthermore, it is preferable that the substrate contain n-type or p-type impurities. The density in impurities may, for example, be $1 \times 10^{17}$ cm$^{-3}$ to $1 \times 10^{20}$ cm$^{-3}$.

The substrate may comprise an insulating material or substrate such as sapphire, $SiO_2$ of the like in part.

The nitride semiconductor substrate can be formed using the two-stage ELO growth method described above, selective growth methods or the like, or a bulk monocrystal may be used, which is formed by hydrothermal synthesis, wherein crystals are grown in a supercritical fluid, high-pressure methods, flux growth, fusion methods and the like. Furthermore, commercially-available products may be used.

Next, as shown in FIG. 7(d), an off angle is formed on the surface of a resulting substrate 101. This off angle is produced by forming a mask having film thickness distribution on the first surface of the substrate 101 (not shown in the drawing), subsequently etching the mask so as to remove it, and continuing to further etch the exposed first surface of the substrate. Alternatively, at the dry etching, the substrate may be etched while setting on the dry etching apparatus (or on the substrate holder of the dry etching apparatus) with incline in the absence of the mask. Etching may be performed by way of wet etching, dry etching (reactive ion etching: RIE, reactive ion beam etching: RIBE, electron cyclotron resonance: ECR, high frequency inductively coupled plasma: ICP, focused ion beam: FIB and the like), CMP processing and the like. From among these, dry etching is preferred because the off angle can easily be controlled. Consequently, because in plane distribution is produced in the first surface of the substrate depending on etching time it is possible to form an off angle of a desired magnitude with respect to a desired direction.

Alternatively, the first surface of the substrate may be subjected to abrasion, grinding, or laser surface treatments, or nitride semiconductor substrates may be cut from bulk with a wire saw so as to have an off angle. Moreover, the heterosubstrate may be produced with an off angle beforehand, so as to carry over the off angle from the heterosubstrate to a nitride semiconductor layer, by growing the nitride semiconductor layer thereupon, so as to produce the substrate from this nitride semiconductor layer.

The principal face of the resulting substrate 101 has an off angle a with respect to the original surface of the nitride semiconductor substrate. By using this to produce a device, it is possible to limit the stress in the semiconductor layer grown on the substrate, making it possible to protect against damage during cleavage.

Step II

Next, as shown in FIG. 8(a), as the nitride semiconductor layer 200, for example, an n-layer, an active layer and a p-layer are built up in that order on the first principal face of the substrate 101 with an under layer (a crack prevention layer or the like, which may be omitted) therebetween. Examples of the semiconductor layer 200 include $In_xAl_yGa_{1-x-y}$ ($0 \leq x \leq 1$, $0 \leq y \leq 1$, $0 \leq x+y \leq 1$).

First, for the n-layer, an n-cladding layer: n-type impurity doped $Al_xGa_{1-x}N$ ($0 \leq x \leq 0.5$), and an n-side optical guide layer: $Al_xGa_{1-x}N$ ($0 \leq x \leq 0.3$) are grown. Note that the terms "cladding layer," "optical guide layer" and the like do not necessarily refer to layers having only those functions, but rather indicate that at least those functions are performed (the same is true for p-layers). If the n-cladding layer is a single layer, this is generally $Al_xGa_{1-x}N$ ($0 \leq x \leq 0.2$), and the preferred film thickness is 0.5 to 5 μm. If this comprises multiple layers, it may have a layered structure comprising a first layer of $Al_xGa_{1-x}N$ ($0 \leq x \leq 0.5$, $0 \leq x \leq 0.1$, and more preferably $0 \leq x \leq 0.3$ and a second layer of $Al_yGa_{1-y}N$ ($0.01 \leq y \leq 1$). It is preferable that the n-layer, and particularly the first layer in the case of a multilayer structure (semiconductor layer containing Al) be produced by lateral growth. By so doing, it is possible to achieve a flatter surface for the semiconductor layer and to limit compositional variations within the semiconductor layer. It is preferable that the lateral growth be performed in a furnace with a growth temperature of no less than 1000° C. and a pressure of no greater than 600 Torr. In the case of a multilayer structure, suitable film thicknesses for the layers, such as a first and a second layer, are from 0.5 to 5 μm.

Next, for the active layer, it is preferable that a semiconductor layer be grown having a multi-quantum well structure represented by $In_xAl_yGa_{1-x-y}N$ ($0 \leq x \leq 1$, $0 \leq y < 1$, $0 < x+y \leq 1$). It is preferable that the composition of the well layer be a mixed crystal with an indium component of $0 < x \leq 0.5$. Examples of suitable film thicknesses for the well layer and the barrier layer include 10 to 300 angstrom and 20 to 300 angstrom; a total film thickness of, for example, approximately 100 to 3000 angstrom is suitable. By keeping the total film thickness in the range of approximately 10 to 300 angstrom, it is possible to lower the $V_f$ and threshold current density. Furthermore, by adjusting the aluminum content, it is possible to achieve emission from the ultraviolet region to the long wavelength side (for example, 300 nm to 650 nm, preferably 360 nm to 580 nm).

The multi-quantum well structure can begin with a barrier layer and end with a well layer, begin with a barrier layer and end with a barrier layer, begin with a well layer and end with a barrier layer, or begin with a well layer and end with a well layer. A preferred structure is one that begins with a barrier layer, followed by 2 to 8 repeats of well layer/barrier layer pairs, and ends with a barrier layer. From the point of view of decreased threshold and increased life, 2 to 3 repeats of the pairs is particularly preferred.

Next, for the p-layer, an electron confinement layer (may be omitted): p-type impurity doped $Al_xGa_{1-x}N$ ($0 \leq x \leq 0.5$) a p-side optical guide layer: $Al_xGa_{1-x}N$ ($0 \leq x \leq 0.3$), a p-cladding layer: p-type impurity doped $Al_xGa_{1-x}N$ ($0 \leq x \leq 0.5$), and a p-side contact layer: p-type impurity doped $Al_xGa_{1-x}N$ ($0 \leq x \leq 1$) are grown in that order. The semiconductor layers may be mixed crystals of indium. The film thicknesses of the various layers may, for example, be approximately 30 angstrom to 5 μm.

The semiconductor layer 200 may have a structure wherein an n-layer is grown on the first principal face of the substrate 101 with a low temperature growth buffer layer: $Al_xGa_{1-x}N$ ($0 \leq x \leq 0.3$), an intermediate layer 202: $Al_xGa_{1-x}N$ ($0 \leq x \leq 0.3$) and/or a crack prevention layer: $In_xAl_yGa_{1-x-y}N$ ($0 \leq x \leq 1$, $0 \leq y < 1$, $0 < x+y \leq 1$) therebetween. Furthermore, a structure wherein a stress relaxation layer is provided between each of the layers, or a GRIN structure may be used. The intermediate layer may have either a single layer structure or a multilayer structure. Layers such as this intermediate layer allow for reductions in the dislocations (threading-dislocations and the like) and pits that are formed on the surface of the semiconductor layer.

The n-cladding layer and the p-cladding layer may have single-layer structures, two-layer structures, or superlattice (SL) structures comprising two layers in having mutually differing component ratios. It is preferable that the total film thickness of the n-side and p-side cladding layers be 0.4 to 10 μm. By these means, it is possible to lower the forward voltage ($V_f$). Furthermore, it is preferable that the overall average aluminum component of the cladding layer be 0.02 to 0.15. By these means, it is possible to limit the formation of cracks and produce a refractive index different from that of the laser waveguide.

Examples of n-type impurities include Si, Ge, Sn, S, O, Ti, Zr, Cd and the like, and examples of p-type impurities include Mg, Be, Zn, Mn, Ca, Sr and the like. Impurity concentrations of approximately $5 \times 10^{16}/cm^3$ to $1 \times 10^{21}/cm^3$ are preferred. N-type impurity concentration at $1 \times 10^7/cm^3$ to $5 \times 10^{19}/cm^3$ is particularly preferred. By these means, it is possible to lower resistivity without damaging the crystalline properties. P-type impurity concentration at $1 \times 10^{19}/cm^3$ to $1 \times 10^{21}/cm^3$ is particularly preferred. By these means, crystalline properties are not degraded. The impurity doping may be modulation doping.

Step III

A wafer, with the semiconductor layer 200 built up on the substrate 101, is removed from the reactor of the semiconductor growing apparatus, and for example as far as the n-side cladding layer, is exposed by etching the semiconductor layer 200. By these means, it is possible to relieve stress. Note that this step can be omitted and that the face exposed by etching does not necessarily have to be the n-side cladding layer. The etching can be performed with a chlorine gas system such as $Cl_2$, $CCl_4$, $BCl_3$ or $SiCl_4$ gas using RIE.

Figure 8:
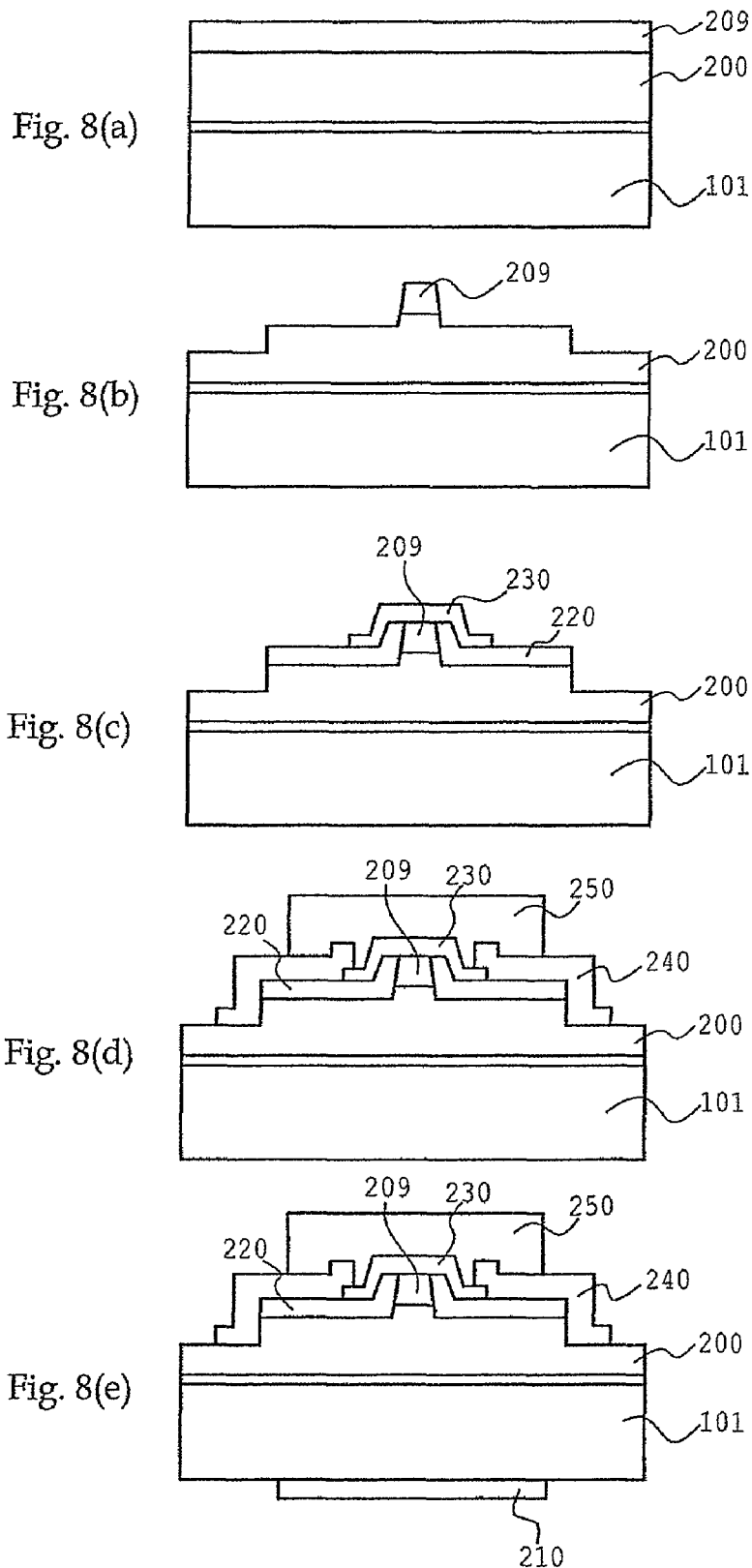
FIG. 8 (a) to (e) are sectional views showing a fabrication process for the nitride semiconductor laser device according to the present invention.

Next, as shown in FIG. 8(*b*), a stripe ridge is formed on the surface of the p-layer. The ridge is formed by first producing a protective film (not shown in the drawing) on the surface of the p-side contact layer 209, which is the topmost p-layer. This protective film is a pattern corresponding to the shape of the ridge. The p-layer is etched away with this protective film as a mask. The ridge defines a waveguide region having a width of approximately 1.0 μm to 100.0 μm; it suffices that the height thereof (etching depth) be within a range wherein at least the p-cladding layer is exposed. The length of the resonator is preferably approximately 300 μm to 1000 μm. If used for signal mode laser light, the width is preferably 1.0 μm to 3.0 μm. If the width of the ridge is 5 μm or more, a high output of 1 W or more will be possible. Furthermore, under maximum current, as the current suddenly spreads out in the lateral direction directly under the ridge, it is preferable that the height of the ridge extend as far as the p-side optical guide layer.

Step IV

Thereafter, as shown in FIG. 8(*c*), the lateral faces of the ridge are protected by an embedding film 220. The embedding film 220 has a smaller refractive index than the semiconductor layer, and it is preferably selected from among insulating materials. Specific examples include single layers and multiple layers of oxides such as $ZrO_2$, $SiO_2$, or oxides of V, Nb, Hf, Ta and Al.

Next, a p-electrode 230 is formed on the upper face of the ridge in the p-side contact layer 209. Preferably, the p-electrode 230 is formed on the p-side contact layer 209 and the embedding film 220. Preferably, the p-electrode has a multilayer structure, such as, for example, Ni (50 to 200 angstrom: bottom layer)/Au (500 to 3000 angstrom: top layer), Ni/Au/Pt (500 to 5000 angstrom) or Ni/Au/Pd (500 to 5000 angstrom).

After forming the p-electrode 230, it is preferable that ohmic annealing be performed in a nitrogen and/or oxygen environment at no less than 300° C. and more preferably no less than 500° C.

Next, as shown in FIG. 8(*d*), a protective film 240 is formed over lateral faces and the like, including the lateral faces of the n-layer exposed in the previous step. The protective film 240 may be formed over at least the lateral faces of n-layer and p-layer, and does not necessarily have to cover a part of the p-electrode 230. Then a pad electrode 250 is formed on the p-electrode 230. The pad electrode 250 can have a layered structure comprising metals such as Ni, Ti, Au, Pt, Pd, W, for example, W/Pd/Au (1000 angstrom or more) or Ni/Ti/Au (1000 angstrom or more).

Step V

As shown in FIG. 8(*e*), an n-electrode 210 is formed on the second principal face of the substrate 101.

It is preferable that the n-electrode be formed over the entire second principal face or a portion thereof from at least one metal selected from the group consisting of Ti, Ni, Au, Pt, Al, Pd, W, Rh, Ag, Mo, V and Hf. By these means, ohmic characteristics can easily be achieved between the substrate and the n-electrode, the adhesion is good, and it is possible to prevent electrode separation during steps such as cleavage for separation from the wafer.

If the n-electrode has a multilayer structure, it is preferable that the topmost layer be Pt or Au. By these means, it is possible to improve heat release from the electrode. It is preferable that the film thickness of the n-electrode be no greater than 10,000 angstrom and more preferably no greater than 6000 angstrom. In the case of a multilayer structure, it is preferable that the substrate side be V, Ti, Mo, W, Hf or the like (500 angstrom or less; 300 angstrom or less in the case of W). In the case of V, it is preferable that the film thickness be 50 to 300 angstrom or less, and more preferably 70 to 200 angstrom. By these means, good ohmic characteristics can be achieved and heat resistance can be improved. Specific examples include, Ti (100 angstrom: substrate side)/Al (5000 angstrom), Ti/Pt/Au (60 angstrom/1000 angstrom/3000 angstrom), Ti (60 angstrom)/Mo (500 angstrom)/Pt (1000 angstrom)/Au (2100 angstrom), Ti (60 angstrom)/Hf (60 angstrom)/Pt (1000 angstrom)/Au (3000 angstrom), Ti (60 angstrom)/Mo (500 angstrom)/Ti (500 angstrom)/Pt (1000 angstrom)/Au (2100 angstrom), W/Pt/Au, W/Al/W/Au, Hf/Al, Ti/W/Pt/Au, Ti/Pd/Pt/Au, Pd/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au, Cr/W/Pt/Au and the like. After forming the n-electrode, this may be annealed at 300° C. or more.

It is preferable that the n-electrode be formed as a rectangle over the second principal face side, other than in the region serving as the scribe the line in the scribe step for breaking the substrate into bars in the next step. Furthermore, a metallized electrode, having the same pattern shape as the n-electrode, may be formed on the n-electrode. By these means, scribing is facilitated and cleavage is improved. Examples of the metallized electrode include Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge and the like.

Furthermore, an off angle, or raised or recessed surface irregularities may also be produced on the second principal face of the substrate.

By forming raised or recessed surface irregularities, if the second principal face is the (000-1) plane, it is possible to expose an inclined face other than the (000-1) face. It is preferable that the inclined face other than the (000-1) face represents no less than 0.5% over the surface area of the face showing n-polarity, and more preferably approximately 1 to 20%. By these means it is possible to improve the ohmic characteristics of the n-electrode.

Herein, the term "surface irregularities" refers to interfacial height differentials of no less than 1 μm, and examples of the shapes of the surface irregularities include tapers and inverse tapers. The planar shape of the surface irregularities can be selected from stripes, lattices, islands, circles, polygons, rectangles, combs and meshes. For example, if these are circular protrusions, the diametrical width of the circular protrusions can be 5 μm or more. Furthermore, it is preferable that a recessed groove includes a region having a width of no less than 3 μm, so as to avoid electrode separation and the like.

In order to expose an inclined plane other than the (000-1) plane on the second principal face, it is suitable to produce an off angle of 0.2 to 90°.

Step VI

The wafer is diced into bars so as to produce cavity ends at the ends of the semiconductor layer at a direction perpendicular to the stripe shaped p-electrode 230. The cavity ends are preferably in the M-plane (1-100) or the A-plane (11-20). Examples of dicing methods include blade breaking, roller breaking, press breaking or the like.

It is preferable that the dicing be performed in a two-step process wherein cleavage-assist grooves are formed and then this is split. By these means, the cavity ends can be formed at good yields.

That is to say, first, cleavage-assist grooves are formed by way of scribing the first or second principal face of the substrate. These grooves are on both sides of the wafer, along the entire surface of the wafer or in the region from which bars will be formed. It is preferable that the grooves be formed in the direction of the cleavage that will produce the bars, with an interval therebetween so as to form a dashed line. By these means, it is possible to limit curvature of the cleavage direction and facilitate cleavage. Furthermore, by forming this groove on the second principal face, it is possible to limit ripple in the FFP and to prevent electrode separation.

Next, the wafer is diced into bars using a breaker. Examples of cleavage methods include blade breaking, roller breaking, press breaking or the like.

A reflective mirror may be formed on the reflecting-side and/or the emitting-side cavity ends that were formed by cleavage. The reflective mirror may be formed as a dielectric multilayer film of $SiO_2$, $ZrO_2$, $TiO_2$, $Al_2O_3$, $Nb_2O_5$ or the like. The use of $Al_2O_3$ or $Nb_2O_5$ on the emitting end is particularly preferred. By these means, working life can be improved. A reflective mirror can be formed with good reproducibility on the cavity ends formed by cleavage.

The resulting bar-shaped substrate is further diced in a direction parallel to the stripe direction to form device chips. It is preferable that the resulting chip be rectangular in shape and that the width of the cavity ends be no greater than 500 μm and more preferably no greater than 400 μm.

Laser devices produced in this manner have characteristics such as long working lives with reduced FFP ripple. Furthermore, because the device has a paired electrode structure, it is possible to reduce the contact resistivity to $1.0E^{-3}$ $\Omega cm^2$ or less.

Note that the device may be a laser device having a plurality of waveguide regions on the substrate or a laser device having a wide ridge.

Furthermore, the device of the present invention preferably has a core region including an active layer between a layer of a first conductivity type (for example, n-type) and a layer of a second conductivity type (for example p-type).

Herein, the term "core region" refers to an optical waveguide region, which is to say a region capable of confining light produced by the active layer and guiding light waves without attenuation. Normally, the core region comprises the active layer and the optical guide layers between which it is interposed, suitable thicknesses therefore being, for example, approximately 100 angstrom to 1.5 μm.

There are no particular restrictions on the semiconductor layers constituting the n-type and p-type layers, but examples include the nitride semiconductor layer described above.

In this device, it is preferable that at least one of the n-type and p-type layers, and particularly the n-type layer be adjacent to the outermost layer of the core region and that the first nitride semiconductor layer (hereinafter referred to as the "first layer") and the second nitride semiconductor layer (hereinafter referred to as the "second layer") be disposed in this order.

In the n-type layer, the first layer and the second layer function as a layer for adjusting the light emission angle, as a optical guide layer and a cladding layer respectively, and these functions can be adjusted by laying down these layers.

In other words, by using a multilayer n-layer or a multilayer p-layer, and in particular a multilayer n-layer, it is possible to narrow the FFP and broaden the NFP, without reducing gain in the active layer. By these means, threshold current can be maintained. Furthermore, it is possible to adjust the light emission angle, so as to increase or decrease it, and to produce a device with increased optical output efficiency and good convergence.

Furthermore, it is preferable that the refractive indexes of the first layer and the outermost layer of the core region, and of the first and second layers, be different; it is particularly preferable that the refractive index of the first layer be lower than that of the outermost layer of the core region and/or that the refractive index of the second layer be lower than that of the first layer. It is preferable that these layers be arranged so that the refractive indexes thereof progressively decrease from the refractive index of the outermost layer of the core region. The resulting stabilized optical confinement allows for stabilization of the beam emitted from the active layer. Consequently, the range of laser light source applications is broadened.

Moreover, it is preferable that the refractive index differential ($\Delta n_1$) between the outermost layer of the core region and the first layer, and/or the refractive index differential ($\Delta n_2$) between the first layer and the second layer, be 0.004 to 0.03. By these means, it is possible to more suitably adjust the region in which the light generated by the active layer is present, allowing for stable optical confinement. Consequently, it is possible to limit the spread angle of the FFP.

Note that the n-type layer is not limited to two layers formed adjacent to the outermost layer of the core region, but maybe three or more layers and, for example, m layers ($m \geq 2$) may be formed. There is no particular upper limit thereupon. With consideration for the optical confinement effect, no greater than 10 layers, more preferably no greater than 8 layers, and still more preferably no greater than 6 layers are suitable. It is particularly preferable that the refractive index differential ($\Delta n_m$) between the outermost layer of the core region and layer number m be within the range of 0.008 to 0.05 and more preferably 0.007 to 0.05. By working within this range, it is possible to relax the optical confinement so as to limit the FFP spread angle while preventing light leakage.

The refractive index of the n-type layer can usually be adjusted by way of the composition thereof, and, for example, the refractive index can be decreased by increasing the aluminum content in the mixed crystal. For example, in order to achieve a refractive index differential of 0.004 to 0.03 between the first layer and the second layer, it is suitable to established a difference in the aluminum component ratio between the two of approximately 0.01 to 0.07.

Furthermore, in cases where the first layer and/or the second layer have a superlattice structure comprising an X layer and a Y layer, the n-type layer refractive index can be adjusted by changing the film thickness of either one of the layers, such as, for example, making the X layer thick in the first layer and making the X layer thin in the second layer.

In the n-type layer, the film thicknesses of the first layer and the second layer are suitably approximately 1000 to 10,000 angstrom. Furthermore, if this comprises a first layer to a layer number m, it is suitable that the total thickness thereof be approximately 2000 to 40,000 angstrom.

In particular, if the n-type layer is formed so as to contain $Al_xGa_{1-x}N$ ($0<x<1$), it is preferable that a layer having a refractive index differential of approximately 0.004 to 0.03 be disposed at a position approximately 500 to 5000 angstrom from the outermost layer of the core region, and that a layer having a refractive index differential of approximately 0.004 to 0.03 be disposed at a position approximately 1500 to 20,000 angstrom in therefrom, and more preferable that a further layer having a refractive index differential of approximately 0.004 to 0.03 be disposed at a position approximately 2500 to 25,000 angstrom therefrom. By these means, it is possible to prevent cracking within the layer, regardless of the composition and film thickness thereof. Accordingly, it is possible to achieve suitable optical confinement.

Furthermore, in a case wherein m layers of n-type nitride semiconductor layer are comprised on the n-type nitride semiconductor layer side, and the p-type nitride semiconductor layer includes a first p-type semiconductor layer, and wherein the n-type nitride semiconductor layer number m has a higher refractive index than the refractive index of the first p-type nitride semiconductor layer, the optical confinement effect on the p-side is strengthened whereby a more stable optical confinement is made possible. Moreover, if the n-side confinement is weaker than the p-side confinement, it is possible to prevent kinks from occurring on the n-side.

If the first layer and the second layer described above are formed for the n-type layer, it is not necessarily the case that a first layer and a second layer must be formed for the p-type layer. If a first layer is formed for the p-type layer, there are no particular restrictions on the refractive index differential between this first layer and the outermost layer of the core region, but for example, approximately 0.01 to 0.2 is suitable. Note that it is preferable that the refractive index of the first layer be less than the refractive index of the outermost layer of the core region. By these means, it is possible to achieve reliable optical confinement. Furthermore, the refractive index differential between layer number m and the first layer is, for example, preferably approximately 0.004 to 0.03. It is preferable that the refractive index of the first layer be smaller than the refractive index of layer number m. Moreover, a suitable film thickness for the first layer is, for example, approximately 1000 to 10,000 angstrom. It is preferable that the first layer have a superlattice structure produced by layering GaN and AlGaN. Furthermore, even if the ratio of aluminum in the mixed crystal is made high, in order that the p-side refractive index be made smaller than the n-side refractive index, it is possible to prevent the formation of internal cracks by reducing the film thickness thereof so that device stability is maintained, which is to say leakage current is reduced.

So long as the optical guide layer comprises a nitride semiconductor and there is a sufficient energy band gap to form a waveguide, there are no particular restrictions on the composition thereof, nor on the film thicknesses or the like, and any structure including a single-layer structure, a multilayer structure, or a superlattice structure may be used. Specifically, for wavelengths of 370 to 470 nm, it is suitable that GaN be used, and at longer wavelengths, it is suitable that an InGaN/GaN multilayer structure or superlattice structure be used. The compositions, film thicknesses, structures and the like of the nitride semiconductors constituting the optical guide layer may be the same or different on the n-side and the p-side.

Note that, in the present invention, specific examples of the layered structure of the core region, the n-type layer and the p-type layer are as follows:

first p-type nitride semiconductor layer: single AlGaN layer, multilayer or superlattice layer AlGaN/GaN p-type optical guide layer: single AlGaN layer, single GaN layer, multilayer or superlattice layer AlGaN/GaN active layer: single InGaN layer, multilayer or superlattice layer InGaN/InGaN, multilayer or superlattice layer InGaN/GaN n-type optical guide layer: single GaN layer, single InGaN layer, single AlGaN layer, multilayer or superlattice layer GaN/AlGaN, multilayer or superlattice layer InGaN/AlGaN, multilayer or superlattice layer AlGaN/AlGaN first n-type nitride semiconductor layer: single AlGaN layer, multilayer or superlattice layer GaN/AlGaN, multilayer or superlattice layer InGaN/AlGaN, multilayer or superlattice layer AlGaN/AlGaN second n-type nitride semiconductor layer: single AlGaN layer, multilayer or superlattice layer GaN/AlGaN, multilayer or superlattice layer InGaN/AlGaN, multilayer or superlattice layer AlGaN/AlGaN Any combination of these layers may be used. In particular, in the case of a superlattice layer, by varying the composition, varying the film thickness, or varying the composition and the film thickness of one or both of the layers, it is possible to establish the refractive index of each of the layers and the refractive index differential in the manner described above.

Hereinafter embodiments of device according to the present invention are described.

Embodiment 1

Figure 2B:
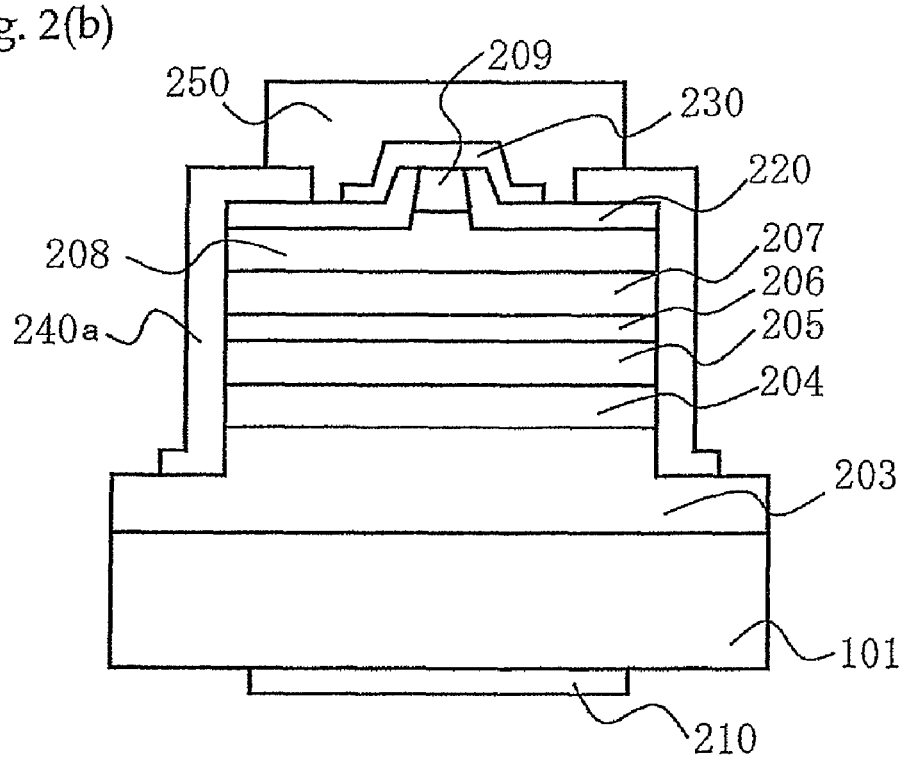

The structure of the semiconductor laser device according to the present embodiment is shown in FIG. 1 (*b*) and FIG. 2(*a*).

This laser device comprises, on a GaN substrate 101 with a principal face having an off angle of 0.3° with regard to the (0001) plane and a dislocation density of no greater than $1 \times 10^6/cm^2$, an n-side cladding layer 203, a n-side optical guide layer 204, an active layer 205, a p-side cap layer 206, a p-side optical guide layer 207, a p-side cladding layer 208, and a p-side contact layer 209 are built up in that order with a low temperature buffer layer (not shown in the drawing) and intermediate layer (not shown in the drawing) therebetween.

A stripe ridge is formed on the p-side contact layer 209 surface and the surface of the p-side cladding layer 208 is exposed on both sides of the ridge.

An embedding film 220 is formed on the exposed face of the p-side cladding layer 208 and the sides of the ridge.

A p-electrode 230 is formed so as to contact the top face of the ridge in the region covering the top of the embedding film 220. A protective film 240 is formed so as to cover the sides of the layered semiconductor body described above, beginning from a position partially overlying the p-electrode 230.

Furthermore, a p-pad electrode 250 is formed on the p-electrode 230, and an n-electrode 210 is formed on the back of the GaN substrate 101.

A semiconductor laser device of this sort can be produced by the following fabrication method.

Nitride Semiconductor Substrate 101

First, a heterosubstrate comprising sapphire or GaAs is placed in an MOCVD reactor and the temperature is set to 500° C. Next, trimethyl gallium (TNG) and ammonia ($NH_3$) are used to grow a buffer layer comprising GaN (200 angstrom). Thereafter, the temperature is set to 1050° C. and a first nitride semiconductor layer (4 μm) comprising GaN is grown.

Next, the wafer is removed from the reactor, stripe-shaped photomasks are formed on a surface of this first nitride semiconductor, and a CVD apparatus is used to form a protective layer comprising $SiO_2$ with a stripe width of 10 to 300 μm and a stripe interval (window) of 5 to 300 μm.

Thereafter this wafer is transferred to an HVPE apparatus and, using Ga metal, HCl gas and ammonia as the source materials, a second nitride semiconductor (400 μm) comprising GaN is grown while doping with silicon (Si) or oxygen (O) as the n-type impurity. Thus, by growing a thick film of GaN of no less than 100 μm on the protective layer by HVPE, it is possible to reduce the crystal defects by two digits or more.

A GaN nitride semiconductor substrate 101 comprising the second nitride semiconductor layer is produced by removing the heterosubstrate and the like. The substrate 101 is approximately 400 μm thick and, at least in the region intended to form the waveguide, the dislocation density is no greater than $1 \times 10^6/cm^2$.

The surface of the resulting substrate 101 is etched while setting in a dry etching apparatus with a predetermined incline. Thus, on the principal face (0001 plane) of the substrate 101 an 0.3° off angle a with respect to this principle plane is produced in the direction in which the ridge is intended to be formed.

N-Side Cladding Layer 203

Next, at 1000° C. to 1080° C., TMA (trimethyl aluminium), TMG, ammonia, and silane gas are used to grow a $Al_{0.03}Ga_{0.97}N$ n-side cladding layer (film thickness 2 μm) doped with Si at $1 \times 10^{18}/cm^3$ to $1 \times 10^9/cm^3$.

N-Side Optical Guide Layer 204

Next, the silane gas is stopped and an undoped GaN n-side optical guide layer (0.175 μm) is grown at 1000° C. to 1080° C. This layer may be doped with n-type impurities and may contain indium.

Active Layer 205

Next, the temperature is set to no greater than 900° C., and a Si doped $In_{0.02}Ga_{0.98}N$ barrier layer (140 angstrom) is grown, whereafter at the same temperature an undoped $In_{0.07}Ga_{0.93}N$ well layer (70 angstrom) is grown. The barrier layer and the well layer are twice alternately layered, and a final barrier layer is formed to produce a multi-quantum well (MQW) structure active layer having a total thickness of 560 angstrom.

P-Side Cap Layer 206

Next, at 900° C. or after raising the temperature, TMG, TMA, ammonia and $Cp_2Mg$ (cyclopentadiethyl magnesium) are used to grow a p-side cap layer (100 angstrom) comprising p-type $Al_{0.25}Ga_{0.75}N$ doped with Mg at $1 \times 10^{19}/cm^3$ to $1 \times 10^{20}/cm^3$ and having a band gap energy greater than a p-side optical guide layer. Note, however, that this layer may be omitted.

P-Side Optical Guide Layer 207

Next, the $Cp_2Mg$ and TMA are stopped, and an undoped GaN p-side optical guide layer (approximately 0.14 μm) is grown at 1000° C. to 1050° C., having a band gap energy lower than the p-side cap layer 206. Note that this layer may be doped with p-type impurities and may contain indium.

P-Side Cladding Layer 208

Thereafter, an undoped $Al_{0.10}Ga_{0.90}N$ layer (25 angstrom) is grown at 1000° C. to 1050° C., next TMA is stopped and an Mg doped GaN layer (25 angstrom) is grown, so as to grow a p-side cladding layer comprising a superlattice layer having a total thickness of 0.4 μm.

P-Side Contact Layer 209

A p-side contact layer (150 angstrom) comprising p-type GaN doped with Mg at $1 \times 10^{20}/cm^3$ is grown on the p-side cladding layer at 1050° C.

Next, the wafer is taken out of the reactor and a $SiO_2$ protective film is formed as a mask on the surface of the topmost p-side contact layer, and RIE etching is performed using $SiCl_4$ gas. By these means, the n-side cladding layer 203 is exposed.

A $SiO_2$ protective film is formed as a stripe-shaped mask on the surface of the p-side contact layer 209, and RIE etching is performed using $SiCl_4$ gas. By these means, a stripe ridge waveguide region is formed.

Next, the sides of the ridge are protected by a $ZrO_2$ embedding layer 220.

Furthermore, in the vicinity of the end face of the ridge, which is the waveguide region, a resist pattern having a plurality of apertures is formed at a position separated from the ridge, using photolithography techniques, and etching is performed using RIE with $SiCl_4$ gas until the n-side cladding layer is reached. By these means, recesses, which are for example hexagonal, are formed on the surface of the p-side contact layer. The maximum distance between the vertices of the recesses is 1 to 10 μm, and preferably 2 to 5 μm. Forming these recesses makes it possible to limit ripple. Note, however, that this step may be omitted.

Next, an Ni (100 angstrom)/Au (1500 angstrom) p-electrode 230 is formed on the surface overlying the p-side contact layer 209 and the embedding layer 220.

Subsequently, a silicon oxide ($SiO_2$) protective film 240 (0.5 μm) is formed by sputtering on the p-electrode 230 and the embedding film 220, and on the sides of the semiconductor layer.

Next, ohmic annealing is performed at 600° C.

Next, Ni (1000 angstrom)/Ti (1000 angstrom)/Au (8000 angstrom) are formed continuously in this order on the exposed p-electrode 230 that is not covered by the protective film, to produce a p-pad electrode 250.

Thereafter, a V (100 angstrom)/Pt (2000 angstrom)/Au (3000 angstrom) n-electrode 210 is formed on the second principal face of the substrate.

Next, recessed grooves (depth: 10 μm, length in the direction parallel to the cavity ends: 50 μm, width perpendicular thereto: 15 μm) are formed on the side of the first principal face of the substrate. These grooves serve as a cleavage-assist grooves, and cleaving is performed from the side of the substrate on which the n-electrode is formed to produce bars in which the cleavage faces (plane 1-100, which is the plane corresponding to the lateral face of a hexagonal crystal, which is to say, the M plane) are the cavity ends.

A dielectric multilayer film is formed on the resonator face.

Lastly, the bar is diced in the direction parallel to the p-electrode 230, to produce semiconductor laser devices as chips.

Figure 9:
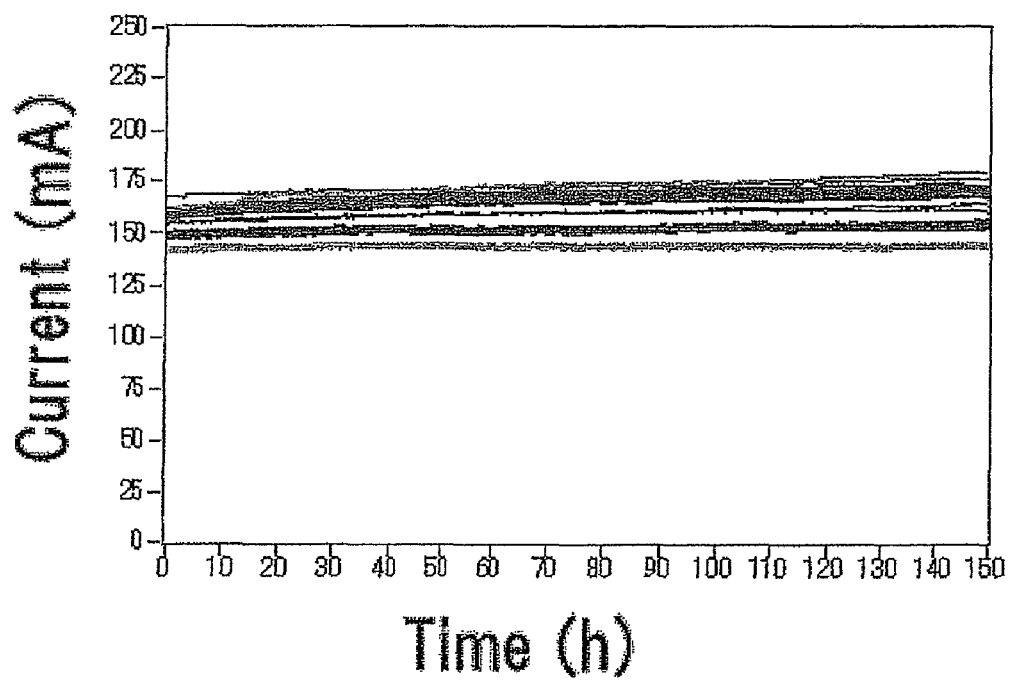
FIG. 9 is a graph showing life data for a nitride semiconductor laser device according to the present invention.

A plurality of the resulting laser devices were disposed on heat sinks, the p-electrodes were wire bonded, and laser emission was attempted at room temperature. The results were that all of the laser devices showed good continuous emission at room temperature, at emission wavelengths of 400 to 420 nm and a threshold current density of 2.9 kA/cm$^2$. Furthermore, there was no cleavage damage to the cavity ends, and as shown in FIG. 9, with an injection current of 140 to 170 mA, an optical output of CW 80 mW and an operating temperature of 70° C., the life was 10,000 hours, meaning that it was possible to manufacture laser devices having particularly good working life characteristics with good reproducibility.

Furthermore, variations in the indium component in the active region of this laser device were measured using micro-photoluminance (μ-PL) on a cut face below the ridge at a depth of 100 μm to 400 μm from the surface of the active layer.

Figure 6:
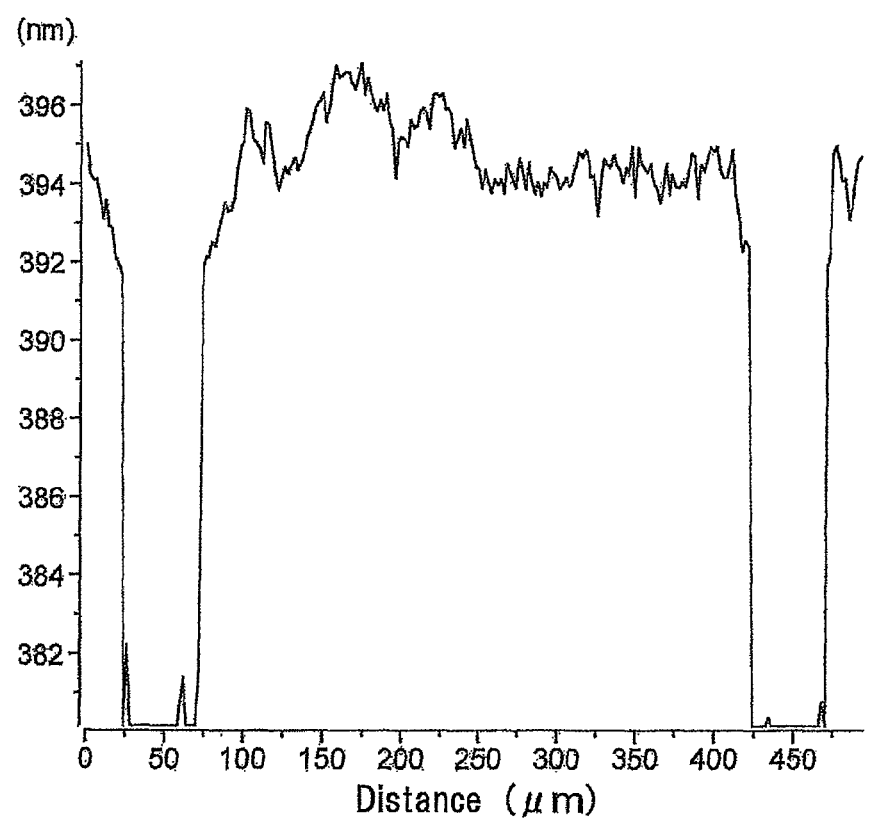
FIG. 6 is micro-PL measurement data for a nitride semiconductor laser device according to the present invention.

The results shown in FIG. 6 demonstrate that variations in the indium component in the active layer were limited.

Note that, by way of comparison, a device was fabricated in the same manner as in Embodiment 1, with the exception of the fact that the substrate did not have an off angle, and the same measurements were performed. The results shown in FIG. 5 indicate a large degree of variation in the active layer indium component.

Embodiment 2

A laser device was fabricated, which was substantially the same as that in Embodiment 1, with the exception of the changes in the composition thereof shown in the following table.

TABLE 1

| | |
|---|---|
| p-side cladding layer | Mg doped $Al_{0.1}Ga_{0.9}N$ (0.5 μm) |
| p-side optical guide layer | undoped GaN (0.2 μm) |
| active layer | Si doped $In_{0.1}Ga_{0.9}N$ barrier layer (700 angstrom) and undoped $In_{0.2}Ga_{0.8}N$ well layer (30 angstrom); GaN barrier layer (700 angstrom) |
| n-side optical guide layer | undoped GaN (0.2 μm) |
| n-side cladding layer | Si doped $Al_{0.1}Ga_{0.9}N$ (1 μm) |

Laser emission was performed with the resulting devices in the same manner as in Embodiment 1.

Good continuous emission was observed at room temperature, at emission wavelengths of 460 to 480 nm and a threshold current density of 2.0 kA/cm$^2$.

Furthermore, there was no cleavage damage to the cavity ends, and with an optical output of CW 80 mW and an operating temperature of 60° C., the life was 3000 hours, meaning that it was possible to fabricate long wavelength laser devices having particularly good working life characteristics with good reproducibility.

Embodiment 3

The GaN substrate used in this embodiment had the C plane (0001) as the principal plane, and was inclined at an off angle a of 0.23° in the perpendicular direction and at an off angle b of 0.06° in the parallel direction, with respect to the M plane (1-100).

Furthermore, on the first and second principal faces of the GaN substrate, a first region ($1^{st}$) comprising the C plane (0001) and a second region ($2^{nd}$) comprising the (000-1) plane, are formed with widths of 400 μm and 20 μm, respectively. Furthermore, the laser device of this embodiment has the constitution shown in the following table. In other respects, the laser device is substantially the same as that of Embodiment 1.

TABLE 2

| | |
|---|---|
| p-side cladding layer | superlattice layer (total film thickness 0.45 μm): undoped $Al_{0.10}Ga_{0.90}N$ (25 angstrom) and Mg doped GaN |

TABLE 2-continued

| | |
|---|---|
| | (25 angstrom) |
| p-side optical guide layer | undoped GaN (0.125 μm) |
| n-side optical guide layer | undoped GaN (0.19 μm) |

Laser oscillation was performed with the resulting devices in the same manner as in Embodiment 1.

Good continuous oscillation was observed at room temperature at emission wavelengths of 400 to 420 nm and a threshold current density of 2.9 kA/cm$^2$. Furthermore, there was no cleavage damage to the cavity ends, and with an optical output of CW 80 mW and an operating temperature of 70° C., the life was 10,000 hours, meaning that it was possible to fabricate laser devices having particularly good working life characteristics with good reproducibility.

Furthermore, variations in the mixed crystal in the active region of this laser device were measured using micro-photoluminance (μ-PL).

Figure 10A:
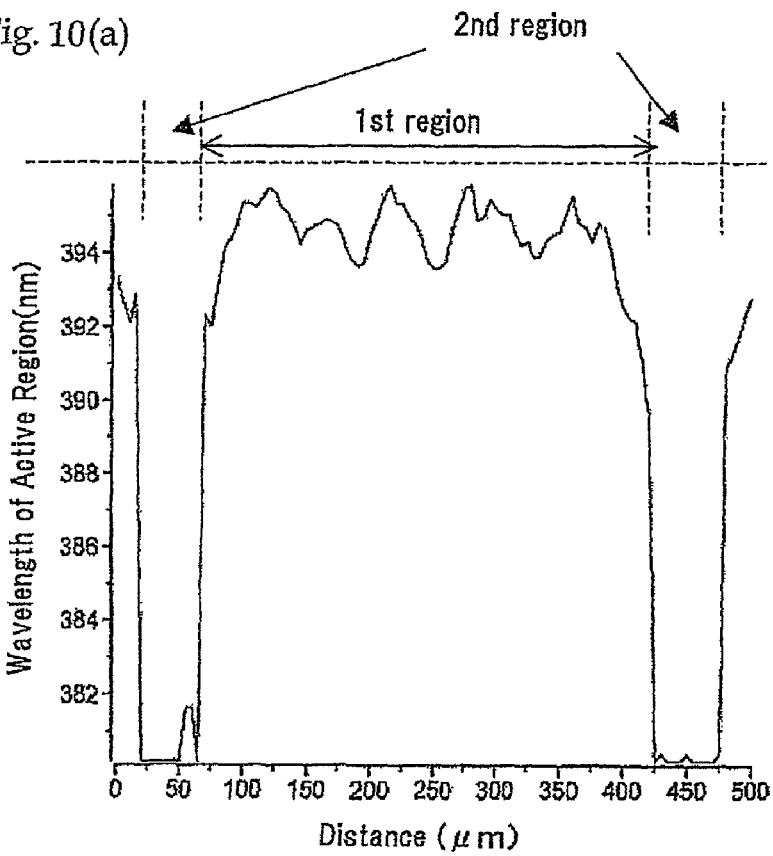
FIG. 10 is a diagram (a) of the crystal mix variation in the active region of a nitride semiconductor laser device according to the present invention, as measured by micro-photoluminescence (μ-PL) and a diagram (b) of the observed surface condition of the nitride semiconductor layer.

The results shown in FIG. 10(a) indicate that the wavelengths were uniform in the first region. Furthermore, the condition of the surface of the nitride semiconductor layer was observed.

Figure 10B:
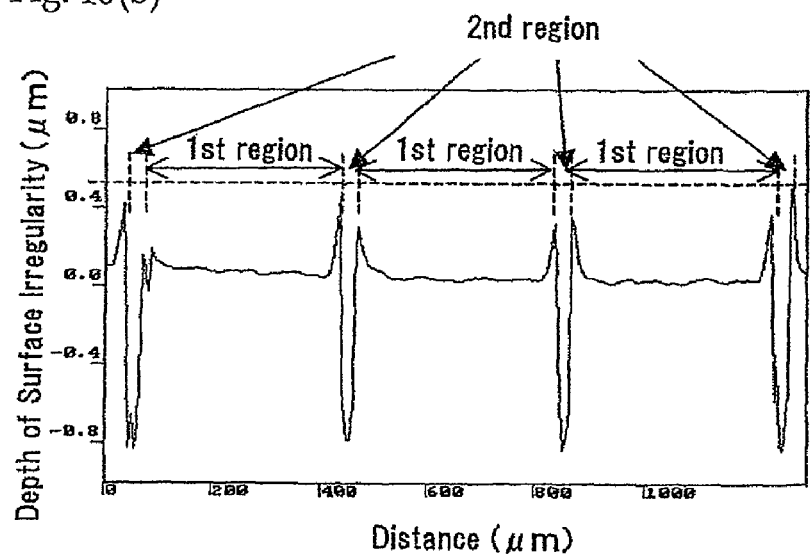

As shown by the results in FIG. 10(b), in the first area, the surface irregularities of the semiconductor layer were flattened to 0.1 μm or less.

Embodiments 4 to 8

Devices were fabricated that were substantially the same as those in Embodiment 3, other than the fact that the off angles a ($\theta_a$) and the off angles b ($\theta_b$) were set to the values shown in the following table.

TABLE 3

| | $\theta_a$ | $\theta_b$ |
|---|---|---|
| Embodiment 4 | 0.20 | 0.14 |
| Embodiment 5 | 0.30 | 0.10 |
| Embodiment 6 | 0.23 | 0.06 |
| Embodiment 7 | 0.20 | 0.14 |
| Embodiment 8 | 0.30 | 0.10 |

Laser emission was performed with the resulting devices in the same manner as in Embodiment 1 and all of the devices had the same long life and excellent flatness as the devices in Embodiment 3.

Embodiment 9

The GaN substrate had an off angle a of 0.3° and an off angle b of 0.05°, in addition to which it had the constitution shown in the following table, but other than this the laser device was substantially the same as that in Embodiment 1.

TABLE 4

| | |
|---|---|
| p-contact | GaN: 15 nm |
| p-cladding | Super Lattice (average Al mixed crystal 0.050): 450 nm ($Al_{0.10}Ga_{0.90}N$: 2.5 nm/GaN: 2.5 nm) |
| p-optical guide | GaN: 145 nm |
| p-cap | $Al_{0.25}GaN_{0.75}N$: 10 nm |
| active layer (MQW) | top barrier layer $In_{0.02}GaN_{0.98}$: 14 nm |
| | 2nd well layer $In_{0.07}GaN_{0.93}$: 7 nm |
| | 2nd barrier layer $In_{0.02}GaN_{0.98}$: 14 nm |
| | 1st well layer $In_{0.07}GaN_{0.93}$: 7 nm |
| | 1st barrier layer $In_{0.02}GaN_{0.98}$: 14 nm |

TABLE 4-continued

| | |
|---|---|
| n-optical guide | GaN: 170 nm |
| n-cladding | n-$Al_{0.036}Ga_{0.0964}N$: 2000 nm |
| ridge width | 7.0 μm |
| resonator length | 650 μm |
| ridge depth | p-optical guide layer etched 50 to 100 nm |
| embedding film | $ZrO_2$: 200 nm |
| p-electrode | Ni: 10 nm/Au: 150 nm |
| n-electrode | V: 10 nm/Ti: 200 nm/Au: 300 nm |
| chip thickness | 80 μm |

Laser emission was performed with the resulting devices in the same manner as in Embodiment 1.

Good continuous emission was observed at room temperature at emission wavelengths of 403 to 407 nm and a threshold current density of 1.8 to 2.0 $kA/cm^2$. Furthermore, with an optical output of CW 200 mW and an operating temperature of 25° C., the life was more than 10,000 hours, meaning that it was possible to fabricate laser devices having particularly good working life characteristics with good reproducibility.

Embodiment 10

The GaN substrate had an off angle a of 0.3° and an off angle b of 0.05°, in addition to which it had the constitution shown in the following table, but other than this the laser device was substantially the same as that in Embodiment 1.

TABLE 5

| | | |
|---|---|---|
| p-contact | GaN: 15 nm | |
| p-cladding | Super Lattice (average Al mixed crystal 0.09): 450 nm | |
| | ($Al_{0.12}Ga_{0.88}N$: 2.5 nm/$Al_{0.07}Ga_{0.93}N$: 2.5 nm) | |
| p-optical guide | $Al_{0.05}Ga_{0.95}N$: 165 nm | |
| p-cap | $Al_{0.30}Ga_{0.70}N$: 13 nm | |
| active layer (SQW) | top barrier layer | AlGaN: 5 nm |
| | well layer | $In_{0.02}GaN_{0.98}$: 15 nm |
| | barrier layer | InGaN: 7 nm |
| n-optical guide | $Al_{0.05}Ga_{0.95}N$: 145 nm | |
| n-cladding | n-$Al_{0.10}GaN_{0.90}N$: 700 nm | |
| InGaN buffer | n-$In_{0.050}Ga_{0.95}N$: 150 nm | |
| AlGaN buffer | n-$Al_{0.02}GaN_{0.098}N$: 500 nm | |
| ridge width | 2.0 μm | |
| resonator length | 650 μm | |
| ridge depth | p-optical guide layer etched 100 nm | |
| embedding film | $ZrO_2$: 200 nm | |
| p-electrode | Ni: 10 nm/Au: 150 nm | |
| n-electrode | V: 10 nm/Ti: 200 nm/Au: 300 nm | |
| chip thickness | 80 μm | |

Laser emission was performed with the resulting devices in the same manner as in Embodiment 1.

Good continuous emission was observed at room temperature at emission wavelengths of 373 to 376 nm and a threshold current density of 3.4 to 3.5 $kA/cm^2$. Furthermore, with an optical output of CW 30 mW and an operating temperature of 25° C., the life was 8000 hours, meaning that it was possible to fabricate laser devices having particularly good working life characteristics with good reproducibility.

Embodiment 11

The GaN substrate had an off angle a of 0.3° and an off angle b of 0.05°, in addition to which it had the constitution shown in the following table, but other than this the laser device was substantially the same as than in Embodiment 1.

TABLE 6

| | | |
|---|---|---|
| p-contact | GaN: 15 nm | |
| p-cladding | Super Lattice (average Al mixed crystal 0.09): 450 nm | |
| | ($Al_{0.12}Ga_{0.88}N$: 2.5 nm/$Al_{0.07}Ga_{0.93}N$: 2.5 nm) | |
| p-optical guide | $Al_{0.05}Ga_{0.95}N$: 165 nm | |
| p-cap | $Al_{0.30}Ga_{0.70}N$: 13 nm | |
| active layer (SQW) | top barrier layer | AlGaN: 5 nm |
| | well layer | $In_{0.02}GaN_{0.98}$: 15 nm |
| | barrier layer | InGaN: 7 nm |
| n-optical guide | $Al_{0.05}Ga_{0.95}N$: 145 nm | |
| n-cladding | n-$Al_{0.10}GaN_{0.90}N$: 700 nm | |
| InGaN buffer | n-$In_{0.050}Ga_{0.95}N$: 150 nm | |
| AlGaN buffer | n-$Al_{0.02}GaN_{0.098}N$: 500 nm | |
| ridge width | 7.0 μm | |
| resonator length | 650 μm | |
| ridge depth | p-optical guide layer etched 100 nm | |
| embedding film | $ZrO_2$: 200 nm | |
| p-electrode | Ni: 10 nm/Au: 150 nm | |
| n-electrode | V: 10 nm/Ti: 200 nm/Au: 300 nm | |
| chip thickness | 80 μm | |

Laser emission was performed with the resulting devices in the same manner as in Embodiment 1.

Good continuous emission was observed at room temperature at emission wavelengths of 373 to 376 nm and a threshold current density of 2.2 to 2.3 $kA/cm^2$. Furthermore, with an optical output of CW 100 mW and an operating temperature of 25° C., the life was more than 1000 hours, meaning that it was possible to fabricate laser devices having particularly good working life characteristics with good reproducibility.

Embodiment 12

The GaN substrate had an off angle a of 0.3° and an off angle b of 0.05°, in addition to which it had the constitution shown in the following table, but other than this the laser device was substantially the same as that in Embodiment 1.

TABLE 7

| | | |
|---|---|---|
| p-contact | GaN: 15 nm | |
| p-cladding | Super Lattice (average Al mixed crystal 0.050): 450 nm | |
| | ($Al_{0.12}Ga_{0.88}N$: 2.5 nm/GaN: 2.5 nm) | |
| p-optical guide | GaN: 300 nm | |
| p-cap | $Al_{0.20}Ga_{0.80}N$: 10 nm | |
| active layer (MQW) | last barrier layer | $In_{0.02}Ga_{0.98}N$: 70 nm |
| | 2nd well layer | $In_{0.11}Ga_{0.89}N$: 3 nm |
| | 2nd barrier layer | GaN: 14 nm |
| | 1st well layer | $In_{0.11}Ga_{0.89}N$: 3 nm |
| | GaN | GaN: 1 nm |
| | 1st barrier layer | $In_{0.02}Ga_{0.98}N$: 70 nm |
| n-optical guide | GaN: 300 nm | |
| n-cladding | n-$Al_{0.06}Ga_{0.94}N$: 1500 nm | |
| InGaN Buffer | n-$In_{0.05}Ga_{0.95}N$: 130 nm | |
| AlGaN Buffer | n-$Al_{0.02}Ga_{0.98}N$: 500 nm | |
| ridge width | 2.0 μm | |
| resonator length | 600 μm | |
| ridge depth | p-optical guide layer etched 180 nm | |
| embedding film | $ZrO_2$: 200 nm | |
| p-electrode | Ni: 10 nm/Au: 150 nm | |
| n-electrode | V: 10 nm/Ti: 200 nm/Au: 300 nm | |
| chip thickness | 80 μm | |

Laser emission was performed with the resulting devices in the same manner as in Embodiment 1.

Good continuous emission was observed at room temperature at emission wavelengths of 442 to 449 nm and a threshold current density of 2.5 $kA/cm^2$. Furthermore, with an optical output of CW 30 mW and an operating temperature of 50° C., the life was 10,000 hours, meaning that it was possible to fabricate laser devices having particularly good working life characteristics with good reproducibility.

Embodiment 13

The GaN substrate had an off angle a of 0.3° and an off angle b of 0.05°, in addition to which it had the constitution shown in the following table, but other than this the laser device was substantially the same as that in Embodiment 1.

TABLE 8

| | |
|---|---|
| p-contact | GaN: 15 nm |
| p-cladding | Super Lattice (average Al mixed crystal 0.050): 450 nm ($Al_{0.10}Ga_{0.88}N$: 2.5 nm/GaN: 2.5 nm) |
| p-optical guide | GaN: 300 nm |
| p-cap | $Al_{0.20}Ga_{0.80}N$: 10 nm |
| active layer (MQW) | last barrier layer $In_{0.02}Ga_{0.98}N$: 70 nm |
| | 2nd well layer $In_{0.11}Ga_{0.89}N$: 3 nm |
| | 2nd barrier layer GaN: 14 nm |
| | 1st well layer $In_{0.11}Ga_{0.89}N$: 3 nm |
| | GaN GaN: 1 nm |
| | 1st barrier layer $In_{0.02}Ga_{0.98}N$: 70 nm |
| n-optical guide | GaN: 300 nm |
| n-cladding | n-$Al_{0.06}Ga_{0.94}N$: 2000 nm |
| InGaN Buffer | n-$In_{0.05}Ga_{0.95}N$: 130 nm |
| AlGaN Buffer | n-$Al_{0.02}Ga_{0.98}N$: 500 nm |
| ridge width | 7.0 μm |
| resonator length | 600 μm |
| ridge depth | p-optical guide layer etched 180 nm |
| embedding film | $ZrO_2$: 200 nm |
| p-electrode | Ni: 10 nm/Au: 150 nm |
| n-electrode | V: 10 nm/Ti: 200 nm/Au: 300 nm |
| chip thickness | 80 μm |

Laser emission was performed with the resulting devices in the same manner as in Embodiment 1.

Good continuous emission was observed at room temperature at emission wavelengths of 442 to 449 nm and a threshold current density of 1.7 to 1.8 kA/cm². Furthermore, with an optical output of CW 150 mW and an operating temperature of 25° C., the life was 10,000 hours, meaning that it was possible to fabricate laser devices having particularly good working life characteristics with good reproducibility.

Embodiment 14

The GaN substrate had an off angle a of 0.3° and an off angle b of 0.05°, in addition to which it had the constitution shown in the following table, but other than this the laser device was substantially the same as that in Embodiment 1.

TABLE 9

| | |
|---|---|
| p-contact | GaN: 15 nm |
| p-cladding | Super Lattice (average Al mixed crystal 0.10): 450 nm ($Al_{0.14}Ga_{0.86}N$: 2.5 nm/$Al_{0.06}Ga_{0.94}N$: 2.5 nm) |
| p-optical guide | Super Lattice: 300 nm (InGaN: 0.5 nm/GaN: 2 nm) |
| p-cap | $Al_{0.20}Ga_{0.8}N$: 10 nm |
| active layer (MQW) | top barrier layer $In_{0.02}Ga_{0.98}N$: 70 nm |
| | 2nd well layer $In_{0.11}Ga_{0.89}N$: 3 nm |
| | 2nd barrier layer GaN: 14 nm |
| | 1st well layer $In_{0.11}Ga_{0.89}N$: 3 nm |
| | GaN GaN: 1 nm |
| | 1st barrier layer $In_{0.02}Ga_{0.98}N$: 70 nm |
| n-optical guide | InGaN(0.5 nm)/GaN(2 nm)SL: 300 nm |
| n-cladding | Super Lattice (average Al mixed crystal 0.10): 1000 nm ($Al_{0.14}Ga_{0.86}N$: 2.5 nm/$Al_{0.06}Ga_{0.94}N$: 2.5 nm) |
| InGaN Buffer | $In_{0.05}Ga_{0.95}N$: 130 nm |
| AlGaN Buffer | n-$Al_{0.02}Ga_{0.98}N$: 500 nm |
| ridge width | 2.5 μm |

TABLE 9-continued

| | |
|---|---|
| resonator length | 600 μm |
| ridge depth | p-optical guide layer etched 180 nm |
| embedding | $ZrO_2$: 200 nm |
| p-electrode | Ni: 10 nm/Au: 150 nm |
| n-electrode | V: 10 nm/Ti: 200 nm/Au: 300 nm |
| chip thickness | 80 μm |

Laser emission was performed with the resulting devices in the same manner as in Embodiment 1.

Good continuous emission was observed at room temperature at emission wavelengths of 467 to 475 nm and a threshold current density of 2.9 kA/cm². Furthermore, with an optical output of CW 20 mW and an operating temperature of 50° C., the life was 5000 hours, meaning that it was possible to fabricate laser devices having particularly good working life characteristics with good reproducibility.

Comparative Examples 1 to 3

Devices were fabricated that were substantially the same as those in Embodiment 3, with the exception of having the off angles shown in the following table.

TABLE 10

Figure 11A:
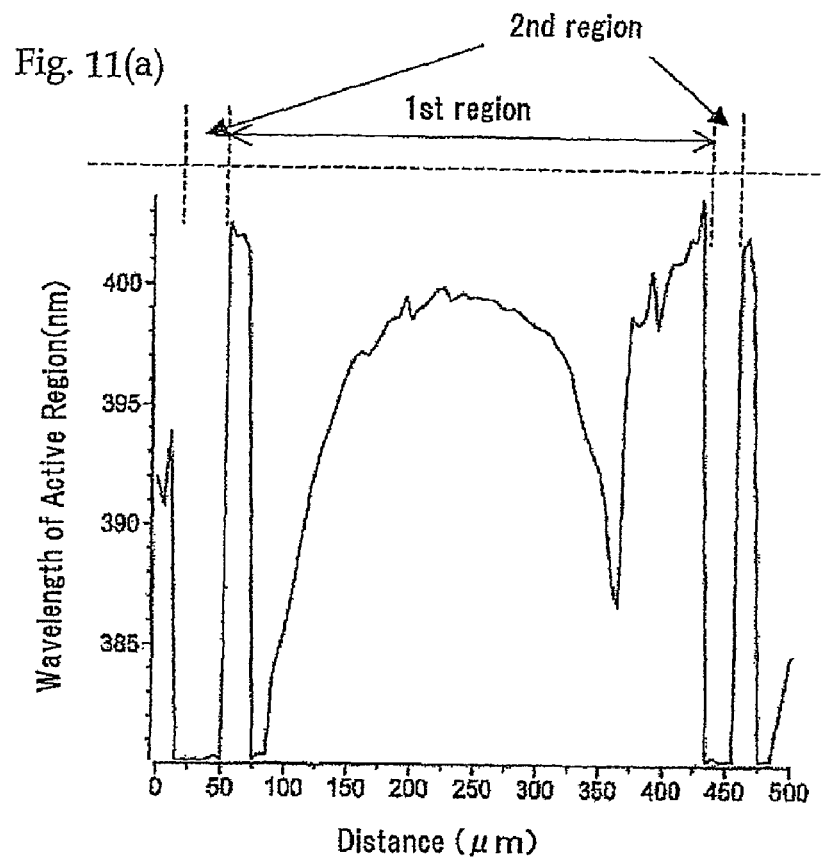
FIG. 11 is a diagram (a) of the crystal mix variation in the active region of a nitride semiconductor laser device according to a comparative example, as measured by micro-photoluminescence (μ-PL) and a diagram (b) of the observed surface condition of the nitride semiconductor layer.
Figure 11B:
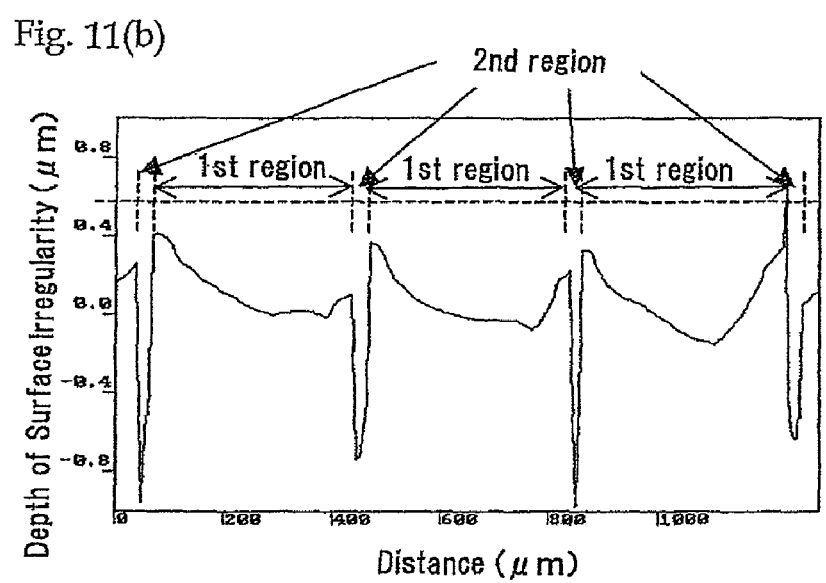
Figure 12A:
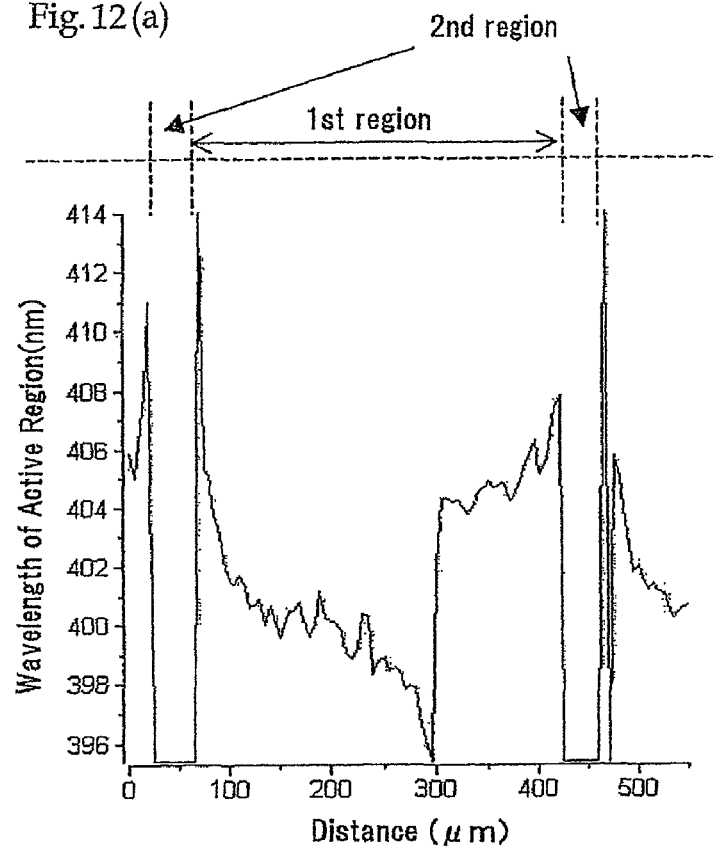
FIG. 12 is a diagram (a) of the crystal mix variation in the active region of a nitride semiconductor laser device according to another comparative example, as measured by micro-photoluminescence (μ-PL) and a diagram (b) of the observed surface condition of the nitride semiconductor layer.
Figure 12B:
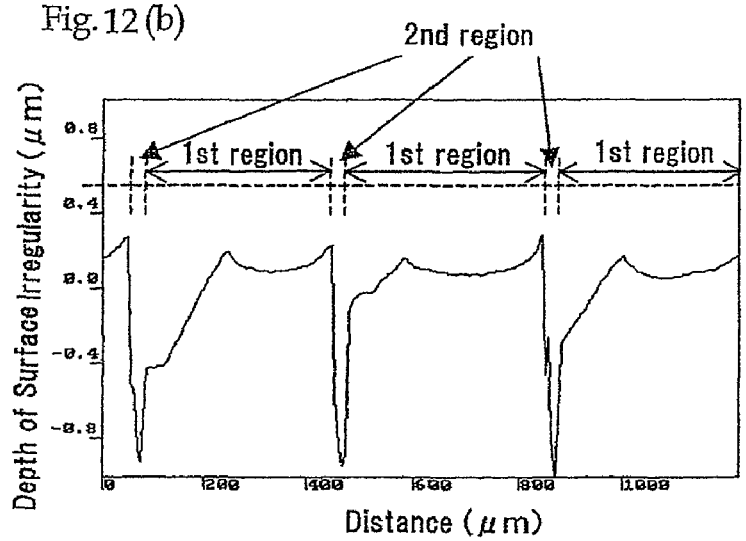
Figure 13A:
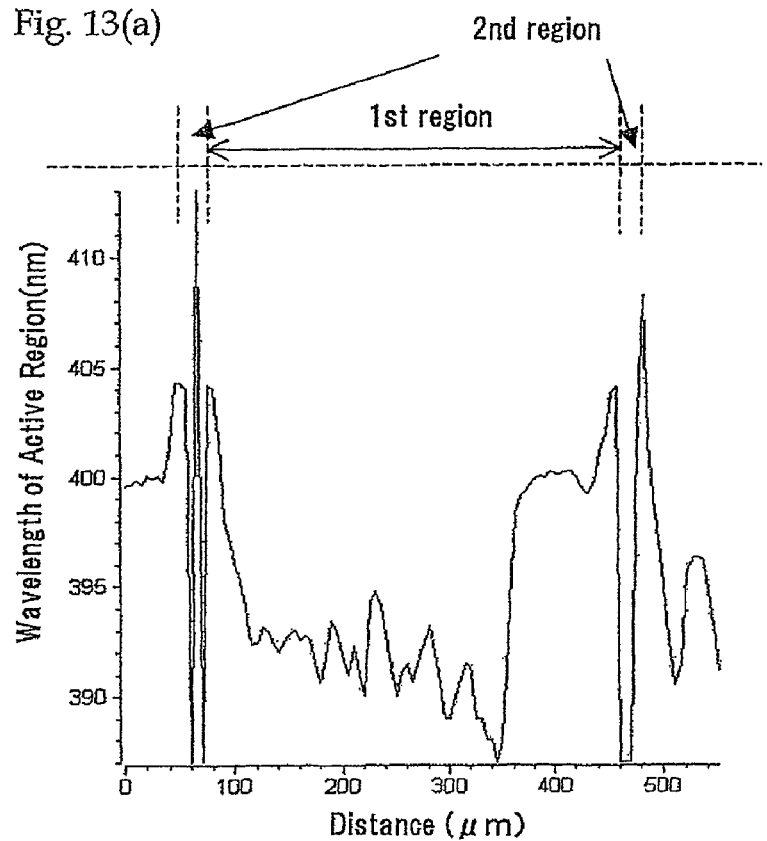
FIG. 13 is a diagram (a) of the crystal mix variation in the active region of a nitride semiconductor laser device according to yet another comparative example, as measured by micro-photoluminescence (μ-PL) and a diagram (b) of the observed surface condition of the nitride semiconductor layer.
Figure 13B:
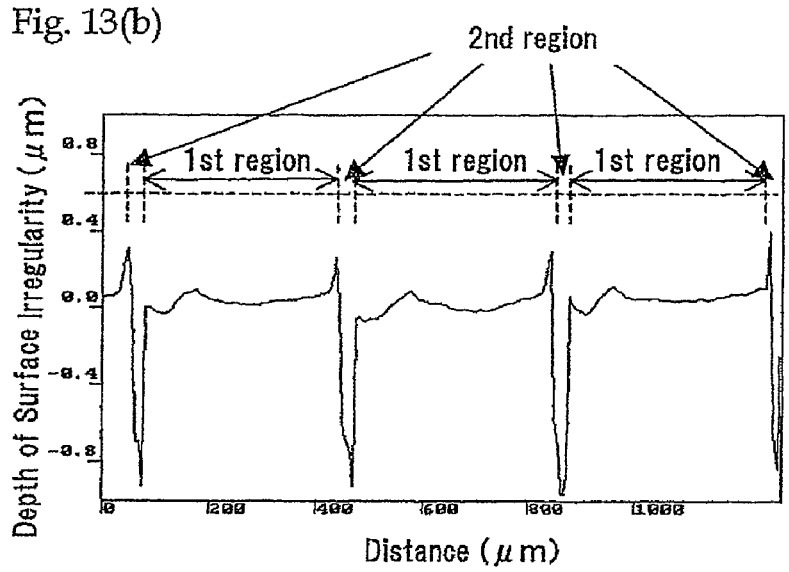

| Comparative Example | $\theta_a$ | $\theta_b$ | variation | Condition of surface |
|---|---|---|---|---|
| 1 | −0.04° | 0.03° | FIG. 11(a) | FIG. 11(b): surface irregularities $\geq$ 0.2 μm |
| 2 | 0.02° | 0.26° | FIG. 12(a) | FIG. 12(b): surface irregularities $\geq$ 0.1 μm (lengthwise and traverse direction of the resonator) |
| 3 | −0.13° | 0.20° | FIG. 13(a) | FIG. 13(b): surface irregularities $\geq$ 0.2 μm |

The mixed crystal component variation in the active region and the surface conditions of the nitride semiconductor layers in these devices were measured in the same manner as in Embodiment 3. As shown in Table 10, the results were that, in all of the comparative examples, wavelengths in the first region were not uniform. Furthermore, the first region of the semiconductor layer was not flattened, but rather had surface irregularities.

Embodiment 15

The device of this embodiment was fabricated as a device substantially the same as that in Embodiment 1, with the exception of changes to the structures of the semiconductor layers, as shown below.

for the n-side layers, the second layer comprises 220 repeats of $Al_{0.08}Ga_{0.92}N$ (25 angstrom)/GaN (25 angstrom) for a superlattice structure with a total film thickness of 1.1 μm (average Al mixed crystal: 4%)

the first layer comprises 60 repeats of $Al_{0.05}Ga_{0.95}N$ (25 angstrom)/GaN (25 angstrom) for a superlattice structure with a total film thickness of 3000 angstrom (average Al mixed crystal: 2.5%)

in the core region, the n-type guide layer is a GaN layer (1700 angstrom)

the active layer comprises two repeats of an $In_{0.05}Ga_{0.95}N$ barrier layer (140 angstrom)/$In_{0.1}Ga_{0.9}N$ well layer (70 angstrom), on which an $In_{0.05}Ga_{0.95}N$ barrier layer (300 angstrom) is formed, for a multi-quantum well structure (MQW) having a total film thickness of approximately 720 angstrom GaN (1500 angstrom) as the p-type guide layer for the p-side layers, the first layer comprises 300 repeats of $Al_{0.1}Ga_{0.9}N$ (20 angstrom)/GaN (20 angstrom) for a superlattice structure with a total film thickness of 4500 angstrom (average Al mixed crystal: 4.9%)

Furthermore, the p-electrode is Ni/Au, the n-electrode is Ti/Al, and the pad electrode is formed of Ni—Ti—Au (1000 angstrom-1000 angstrom-8000 angstrom). The resonator is 650 μm long.

Using these devices, all of the laser devices showed good continuous emission at room temperature at an emission wavelength of 405 nm and a threshold current density of 2.8 kA/cm².

Furthermore, there was no cleavage damage to the cavity ends, and with an optical output of CW 5 mW and an operating temperature of 60° C., the life was more than 2000 hours, meaning that it was possible to manufacture laser devices having particularly good working life characteristics with good reproducibility.

Furthermore, the spread angle and aspect ratio of this device were measured and compared to the comparative examples shown below. The results were that it was possible to reduce the spread angle by approximately 8% and the aspect ratio by approximately 6%.

For the comparative examples, in the device described above, instead of providing a second n-type nitride semiconductor layer and a first n-type nitride semiconductor layer, an n-type cladding layer of $Al_{0.08}Ga_{0.92}N$ (25 angstrom)/GaN (25 angstrom) was repeated to form only one layer of a superlattice structure (average Al mixed crystal: 4%) having a total film thickness of 1.4 μm.

Embodiment 16

This embodiment is the same as the device of Embodiment 15, other than using a two-layer superlattice structure for the second layer in the n-side layer. That is to say, an undoped $Al_{0.12}Ga_{0.88}N$ A layer is grown to 25 angstrom at 1050° C., using TMA, TMG and ammonia as source gasses, whereafter the TMA is stopped and silane gas is used as the impurity gas to grow a GaN B layer doped at $5\times10^{18}/cm^3$ with Si to a film thickness of 25 angstrom. Then the A and B layers were built up by repeating these operations 160 times to form a second n-type nitride semiconductor layer bottom layer as a multilayer film (superlattice structure) having a total film thickness of 8000 angstrom. This second layer bottom layer has an average mixed crystal aluminum component of 6%.

Next, an undoped $Al_{0.08}Ga_{0.92}N$ A layer is grown to 25 angstrom at 1050° C., using TMA, TMG and ammonia as source gases, whereafter the TMA is stopped and silane gas is used as the impurity gas to grow a GaN B layer doped at $5\times10^{18}/cm^3$ with Si to a film thickness of 25 angstrom. Then the A and B layers were built up by repeating these operations 60 times to form a second-layer top layer as a multilayer film (superlattice structure) having a total film thickness of 3000 angstrom. This second-layer top layer has an average mixed crystal aluminum component of 4%.

Thereafter, the first n-type nitride semiconductor layer onwards was formed in the same manner as in Embodiment 15 to produce a nitride semiconductor device.

The same evaluations as in Embodiment 1 were performed for the resulting device and the spread angle and aspect ratio were measured. The results obtained were similar to those for Embodiment 1.

Furthermore, the spread angle was reduced by approximately 20% and the aspect ratio was reduced by approximately 13% with respect to the foregoing comparative example. In other words, it was confirmed that, as a result of relaxing the optical confinement effect, it was possible to limit the spread angle of the light in the FFP, whereby the aspect ratio could be reduced.

The device of the present invention can be used in optical disk applications, optical communications systems, printers, optical exposure applications, and various devices for measurement and the like. Furthermore, it is useful as an excitation light source or the like for biotechnology applications capable of detecting the presence or position of a substance that is sensitive to specific wavelengths (in the vicinity of 470 to 490 nm) by irradiating the same light produced by the device of the present invention.

By virtue of the device of the present invention, because the principal face of the nitride semiconductor substrate has an off angle in a predetermined direction, it is possible to achieve uniform compositional distribution in the nitride semiconductor layer, for example, in terms of crystalline characteristics and indium content in the active layer. This is because it is possible to achieve flat crystal growth, beginning with surface irregularities in the atomic plane. Consequently, the interface with the semiconductor layer grown on the principal face of the substrate has reduced recessed or protruding height-differential surface irregularities, allowing for more uniform compositional distribution in an active layer capable of achieving emission wavelengths in a range extending from the ultraviolet region of 365 nm or less to a long wavelength region of 500 nm or more. Moreover, it is possible to produce devices having excellent useful life and device characteristics in this broad wavelength band.

Furthermore, if the refractive indexes of predetermined semiconductor layers in the device of the present invention have a predetermined relationship, it is possible to suitably adjust the region in which the light generated in the active layer is present, so as to achieve stable optical confinement and thus improve COD level. In addition, it is possible to reduce the spread angle of the light intensity distribution in the perpendicular direction, and to optimize or reduce the aspect ratio to 2 or less. Consequently, it is possible to prevent increases in the threshold voltage due to optical leakage and to produce a highly reliable device with increased optical output efficiency and good convergence.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A nitride semiconductor laser device comprising:
  a nitride semiconductor substrate having a first principal face;
  a nitride semiconductor layer having a first conductivity type;
  an active layer; and
  a nitride semiconductor layer having a second conductivity type that is different from the first conductivity type and including a stripe ridge formed on the surface thereof,
  the nitride semiconductor layer having the first conductivity type, the active layer and the nitride semiconductor layer having the second conductivity type being formed on the first principal face of the nitride semiconductor substrate in this order, the first principal face of the nitride semiconductor substrate having an off angle a ($\theta a$) in a direction substantially parallel to the stripe ridge, and an off angle b ($\theta b$) in a direction substantially perpendicular thereto, with respect to a reference crystal plane, $|\theta a| > |\theta b|$ is satisfied, and a second principal face of the nitride semiconductor substrate having an off angle of 0.2 to 90°.

2. The nitride semiconductor laser device of claim 1, wherein $0.1° \leq |\theta a| \leq 0.7°$ is satisfied.

3. The device of claim 1, wherein
the (000-1) face and an inclined face other than the (000-1) face are exposed on the second principal face of the nitride semiconductor substrate,
the inclined face other than the (000-1) face represents no less than 0.5% over the surface area of the second principal face.

4. The nitride semiconductor laser device of claim 1, wherein
the first principal face of the nitride semiconductor substrate comprises a first region comprising the C face (0001) and a second region having at least a crystal growth face different from that of the first region.

5. The nitride semiconductor laser device of claim 1, further comprising
an electrode formed on the second principal face of the nitride semiconductor substrate.

6. The nitride semiconductor laser device of claim 5, wherein
the electrode has the contact resistivity to the nitride semiconductor substrate of $1.0 \times 10^{-3} \Omega \cdot cm^2$ or less.

7. The nitride semiconductor laser device of claim 1, wherein
the active layer has one of a multiple quantum well structure and a single quantum well structure, and the active layer includes a well layer that contains indium, and
the well layer of the active layer is a mixed crystal with a content rate of indium being equal to or less than 0.5.

8. The nitride semiconductor laser device of claim 1, wherein
the first principal face of the nitride semiconductor substrate includes the (0001) face and the first principal face is inclined with a prescribed off angle with respect to the (0001) face.

* * * * *